(12) United States Patent
Park et al.

(10) Patent No.: US 11,522,470 B2
(45) Date of Patent: Dec. 6, 2022

(54) DISPLAY APPARATUS

(71) Applicant: LG ELECTRONICS INC., Seoul (KR)

(72) Inventors: Jongha Park, Seoul (KR); Dongyun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1301 days.

(21) Appl. No.: 15/923,782

(22) Filed: Mar. 16, 2018

(65) Prior Publication Data

US 2018/0269808 A1    Sep. 20, 2018

(30) Foreign Application Priority Data

Mar. 20, 2017    (KR) .................. 10-2017-0034838

(51) Int. Cl.
| | | |
|---|---|---|
| H02N 2/00 | (2006.01) | |
| H01L 41/053 | (2006.01) | |
| G06F 3/01 | (2006.01) | |
| H04R 1/22 | (2006.01) | |
| H04R 17/00 | (2006.01) | |
| H01L 51/52 | (2006.01) | |
| H01L 41/09 | (2006.01) | |
| H04R 5/02 | (2006.01) | |
| H04R 7/04 | (2006.01) | |

(52) U.S. Cl.
CPC .......... *H02N 2/0015* (2013.01); *G06F 3/016* (2013.01); *H01L 41/053* (2013.01); *H04R 1/22* (2013.01); *H04R 17/00* (2013.01); *H01L 41/094* (2013.01); *H01L 51/5246* (2013.01); *H04R 5/02* (2013.01); *H04R 7/045* (2013.01); *H04R 2307/025* (2013.01); *H04R 2400/03* (2013.01); *H04R 2440/05* (2013.01); *H04R 2499/11* (2013.01); *H04R 2499/15* (2013.01)

(58) Field of Classification Search
CPC .... H02N 2/0015; H01L 41/053; H01L 41/094
See application file for complete search history.

(56) References Cited

U.S. PATENT DOCUMENTS

| | | | |
|---|---|---|---|
| 2005/0007342 A1 | 1/2005 | Cruz-Hernandez et al. | |
| 2009/0045700 A1 | 2/2009 | Sasaki et al. | |

(Continued)

FOREIGN PATENT DOCUMENTS

| | | |
|---|---|---|
| CN | 101512468 | 8/2009 |
| CN | 102265248 | 11/2011 |

(Continued)

OTHER PUBLICATIONS

European Patent Office Application Serial No. 18162693.8, Search Report dated Jul. 19, 2018, 9 pages.

(Continued)

*Primary Examiner* — Derek J Rosenau
(74) *Attorney, Agent, or Firm* — Lee, Hong, Degerman, Kang & Waimey PC

(57) ABSTRACT

A display apparatus is disclosed. The display apparatus includes a display panel, a supporter attached to a rear surface of the display panel, and a piezoelectric vibration unit including a fixing portion attached to the supporter and a cantilever portion overhanging from the supporter.

20 Claims, 19 Drawing Sheets

(56) References Cited

U.S. PATENT DOCUMENTS

2011/0304569 A1* 12/2011 Kai ................... G06F 11/1402
  345/173
2018/0081438 A1* 3/2018 Lehmann ............. G06F 3/0202

FOREIGN PATENT DOCUMENTS

CN    10288491      1/2013
CN    105653026     6/2016

OTHER PUBLICATIONS

State Intellectual Property Office of the People's Republic of China Application Serial No. 201810228783.7, Office Action dated Mar. 18, 2020, 8 pages.

* cited by examiner

DISPLAY APPARATUS

CROSS-REFERENCE TO RELATED APPLICATION

Pursuant to 35 U.S.C. § 119(a), this application claims the benefit of earlier filing date and right of priority to Korean Patent Application No. 10-2017-0034838, filed on Mar. 20, 2017, the contents of which are hereby incorporated by reference herein in its entirety.

BACKGROUND OF THE INVENTION

1. Field of the Invention

The present invention relates to a display apparatus that generates vibration.

2. Description of the Related Art

There are various kinds of display panels for generating images, for example, liquid crystal displays (LCDs), plasma display panels (PDPs), electro-luminescent displays (ELDs), vacuum fluorescent displays (VFDs), organic light-emitting diode (OLED) displays, etc.

A display apparatus equipped with a display panel and a vibration unit for generating vibration has been developed. The vibration unit is a sound output device (e.g. a speaker) or a haptic device (e.g. a linear motor) that enables a user to feel tactile vibration.

Representative examples of the vibration unit include a moving-coil device (e.g. a moving-coil speaker), which generates vibration energy by applying current to a coil, and a piezoelectric vibration device (e.g. a piezoelectric actuator), which generates vibration energy using the piezoelectric effect.

The piezoelectric effect is the ability of certain materials, such as ceramics, etc., to generate an electric charge when mechanical stress is applied thereto, and, conversely, to expand or contract when electrical energy is applied thereto. As materials used to manufacture a piezoelectric vibration device, lead zirconate titanate (Pb(Ti, Zr)O3)(PZT), barium titanate (BaTiO3), lead titanate (PbTiO3), lithium niobate (LiNbO3), quartz (SiO2), etc. are well known.

In a conventional display apparatus, a diaphragm for a device for generating acoustic or tactile vibration (the moving-coil device or the piezoelectric vibration device) is disposed so as to be spaced apart from the display panel.

It is known that the frequency range audible by a human being is from 20 Hz to 20,000 Hz and that the frequency of sounds generated in daily life does not usually exceed 10,000 Hz. If a relatively high range within the frequency range from 20 Hz to 16,000 Hz is defined as a high frequency range and a relatively low range is defined as a low frequency range, the human voice in daily life falls within the low frequency range. Further, the frequency that a human being can perceive using the sense of touch also falls within the low frequency range.

It is possible to manufacture a lighter and smaller piezoelectric vibration device than a moving-coil device. However, the magnitude of output in the low frequency range of the piezoelectric vibration device is smaller than that of the moving-coil device.

SUMMARY OF THE INVENTION

The prior art has a problem in that the immersion level of a viewer is decreased due to a distance between a display panel for outputting images and a position at which vibration is generated by a vibration device. It is a first object of the present invention to solve this problem with the prior art and to increase the immersion level of a viewer.

The prior art has a problem in that the realism of an image is degraded due to a long distance between a sound generation position in the image that a viewer visually recognizes (e.g. a person's mouth in the image) and a position from which a sound that the viewer acoustically perceives comes (a sound image). It is a second object of the present invention to solve this problem with the prior art and to minimize the distance between the visual sound generation position and the acoustical sound generation position.

In the prior art, when a user touches a display panel of a display apparatus, which is put in a case, to generate vibration (for example, when a user grabs a smartphone with one hand and touches a display panel of the smartphone with the other hand), the magnitude of the tactile vibration that the user feels at the contact point between the display panel and the user is smaller than the magnitude of the tactile vibration that the user feels at the contact point between the case and the user. Therefore, the prior art has a problem in that the correlation between the image and the vibration is reduced and a perceived disconnect between the image and the vibration occurs. It is a third object of the present invention to solve this problem with the prior art and to minimize the distance between the visual vibration generation position (the position of the image) and the tactile vibration generation position.

The prior art has a problem in that the magnitude of output in the low frequency range of the piezoelectric vibration device is relatively small. It is a fourth object of the present invention to solve this problem with the prior art and to further increase the magnitude of the vibration output in the low frequency range for a given applied voltage.

The prior art has a problem in that a moving-coil device having a large volume must be used in order to greatly increase the magnitude of output in the low frequency range, leading to an increase in the volume or the thickness of the display apparatus. It is a fifth object of the present invention to solve this problem with the prior art.

It is a sixth object of the present invention to increase the efficiency of the vibration output in the high frequency range while accomplishing the above objects.

The prior art has a problem in that it is difficult to greatly increase the output only in a specific sub-range in the low frequency range using a conventional piezoelectric vibration device. It is a seventh object of the present invention to solve this problem with the prior art and to greatly amplify an increase in the magnitude of output in a predetermined specific sub-range in the low frequency range.

It is an eighth object of the present invention to enable a designer to easily determine a specific sub-range in which an increase in the magnitude of output is greatly amplified.

It is a ninth object of the present invention to enable a designer to predetermine a plurality of specific sub-ranges in which an increase in the magnitude of output is greatly amplified.

It is a tenth object of the present invention to perform control so as to selectively realize amplification in any one or all of the plurality of predetermined sub-ranges.

Objects to be accomplished by the invention are not limited to the above-mentioned objects, and other objects not mentioned will be clearly understood by those skilled in the art from the following description.

In accordance with an aspect of the present invention, the above and other objects can be accomplished by the provision of a display apparatus including a display panel, a supporter attached to a rear surface of the display panel, and at least one piezoelectric vibration unit. The piezoelectric vibration unit includes a fixing portion attached to the supporter and a cantilever portion overhanging from the supporter.

The piezoelectric vibration unit may be formed in a rectangular shape when seen from rear side. The cantilever portion may overhang in a direction parallel to any one side of the rectangular shape.

The cantilever portion may overhang in a direction parallel to a long side of the rectangular shape.

A front surface of the fixing portion is attached to a rear surface of the supporter. The cantilever portion may be spaced apart from the rear surface of the display panel.

The cantilever portion may have a predetermined overhanging length being greater than or equal to a fixing length of the fixing portion.

The cantilever portion may have a predetermined overhanging length being greater than to a fixing length of the fixing portion.

the overhanging length and the fixing length are measured in a direction in which the cantilever portion overhangs.

The overhanging length may be at least four times as large as the fixing length.

The piezoelectric vibration unit may have a thickness from 0.6 mm to 1 mm.

A sum of the overhanging length and the fixing length may be from 35 mm to 45 mm.

The cantilever portion may have an overhanging length of 20 mm or more. More preferably, the overhanging length of the cantilever portion may be 30 mm or more.

The piezoelectric vibration unit may include a one-directional cantilever portion extending from the fixing portion in one direction and a other-directional cantilever portion extending from the fixing portion in a direction perpendicular to the one direction or in a direction opposite the one direction.

The cantilever portion may overhang from adjacent sides or opposite sides of the supporter.

The cantilever portion may overhang from two adjacent sides of the supporter.

The cantilever portion may overhang from two opposite sides of the supporter.

The piezoelectric vibration unit may include a first-directional cantilever portion extending from the fixing portion in a first direction, a second-directional cantilever portion extending from the fixing portion in a direction perpendicular to the first direction, and a third-directional cantilever portion extending from the fixing portion in a direction opposite the first direction.

The piezoelectric vibration unit may further include a fourth-directional cantilever portion extending from the fixing portion in a direction opposite the second direction.

The cantilever portion may overhang from three or more sides of the supporter.

The cantilever portion may overhang from three sides of the supporter.

The cantilever portion may overhang from all sides of the supporter.

The at least one piezoelectric vibration unit may include a plurality of piezoelectric vibration units, and the plurality of piezoelectric vibration units may include cantilever portions having predetermined overhanging lengths, at least two of the overhanging lengths being different from each other.

The at least one piezoelectric vibration unit may include a plurality of piezoelectric vibration units, and the plurality of piezoelectric vibration units may include a first piezoelectric vibration unit including a first cantilever portion overhanging a first overhanging length and a second piezoelectric vibration unit including a second cantilever portion overhanging a second overhanging length, which is different from the first overhanging length.

The plurality of piezoelectric vibration units may include a first piezoelectric vibration unit comprising a first cantilever portion and a first fixing portion, a second piezoelectric vibration unit comprising a second cantilever portion and a second fixing portion, and a third piezoelectric vibration unit comprising a third cantilever portion and a third fixing portion.

The first cantilever portion may overhang from a first side of the supporter, and the second cantilever portion may overhang from a second side of the supporter opposite the first side.

The third cantilever portion may overhang from at least a third side of the supporter.

the cantilever portion may comprise a one-directional cantilever portion which overhangs from the first side of the supporter and a other-directional portion which overhangs from the second side of the supporter.

The display apparatus may further include a control unit performing control such that electric energy is selectively applied to the first piezoelectric vibration unit and the second piezoelectric vibration unit.

The first cantilever portion of the first piezoelectric vibration unit may overhang in a direction opposite a direction in which the second cantilever portion of the second piezoelectric vibration unit overhangs.

The first cantilever portion of the first piezoelectric vibration unit may overhang from a first side of the supporter, and the second cantilever portion of the second piezoelectric vibration unit may overhang from a second side of the supporter opposite the first side.

The first overhanging length may be greater than the second overhanging length, and the fixing portion of the first piezoelectric vibration unit may have a fixing length shorter than a fixing length of the fixing portion of the second piezoelectric vibration unit.

The supporter may include a plurality of levels, and the plurality of piezoelectric vibration units include a first piezoelectric vibration unit attached to a first level of the plurality of levels, and a second piezoelectric vibration unit attached to a second level of the plurality of levels.

The supporter may include a first base attached to the rear surface of the display panel, a second base disposed behind the first base while being spaced apart from the first base, and a connection portion connecting the first base and the second base so as to support the second base. The plurality of piezoelectric vibration units may include a piezoelectric vibration unit attached to the first base and a piezoelectric vibration unit attached to the second base.

In accordance with another aspect of the present invention, a display apparatus includes a display panel, a supporter attached to a rear surface of the display panel, and first to $n^{th}$ piezoelectric vibration units attached to the supporter. Each of the first to $n^{th}$ piezoelectric vibration units includes a fixing portion attached to the supporter and a cantilever portion overhanging from the supporter. The cantilever portion of each of the first to $n^{th}$ piezoelectric vibration units has an overhanging length different from an overhanging length of the cantilever portion of at least one of remaining ones of the first to $n^{th}$ piezoelectric vibration units. Here, n is a natural number of 2 or more.

The display apparatus may further include a control unit performing control such that electric energy is selectively applied to the first to $n^{th}$ piezoelectric vibration units.

N may be a natural number of 3 or more. The cantilever portion of the first piezoelectric vibration unit may overhang in a direction opposite a direction in which the cantilever portion of the second piezoelectric vibration unit overhangs, and the supporter may be formed to extend lengthwise in a direction perpendicular to the direction in which the cantilever portion overhangs so as to provide an area to which the third piezoelectric vibration unit is attached.

In accordance with a further aspect of the present invention, a display apparatus includes a display panel, a first supporter attached to a rear surface of the display panel, and a second supporter attached to the rear surface of the display panel and spaced apart from the first support. The display apparatus includes a first piezoelectric vibration unit including a first fixing portion attached to the first supporter and a first cantilever portion overhanging from the first supporter by a first overhanging length. The display apparatus includes a second piezoelectric vibration unit including a second fixing portion attached to the second supporter and a second cantilever portion overhanging from the second supporter by a second overhanging length. The first overhanging length and the second overhanging length are different from each other.

BRIEF DESCRIPTION OF THE DRAWINGS

The above and other objects, features and other advantages of the present invention will be more clearly understood from the following detailed description taken in conjunction with the accompanying drawings, in which:

FIG. 8a illustrates one embodiment 311 of a side cover 310, FIG. 8b illustrates another embodiment 312 of the side cover 310, FIG. 8c illustrates a further embodiment 313 of the side cover 310, and FIG. 8d illustrates another further embodiment 314 of the side cover 310;

FIG. 9 illustrates a perspective view showing the state in which the piezoelectric vibration unit 50 is directly attached to the rear surface of a display panel 100 without a supporter 80 and an experimental graph (type O1) in accordance therewith;

FIG. 10 illustrates a perspective view showing the state in which the entire surface of the piezoelectric vibration unit 50 is attached to the supporter 80 without a cantilever portion 55 and an experimental graph (type O2) in accordance therewith;

FIGS. 11a to 11e illustrate perspective views of the piezoelectric vibration unit 50 including the cantilever portion 55 corresponding to type A1 depicted in FIG. 3 and experimental graphs in accordance with overhanging lengths D (35 mm, 30 mm, 27.5 mm, 25 mm and 20 mm) of the cantilever portion 55 as compared with the graph (type O2) in FIG. 10;

FIG. 12 illustrates a perspective view of two piezoelectric vibration units 50, each including a respective one of cantilever portions 55 having overhanging lengths D1 and D2 different from each other, corresponding to type A2 depicted in FIG. 3 and experimental graphs in accordance with the state in which a first piezoelectric vibration unit 50(1) including a cantilever portion 55 having an overhanging length D1 of 35 mm and a second piezoelectric vibration unit 50(2) including a cantilever portion 55 having an overhanging length D2 of 25 mm generate outputs at the same time as compared with the graph (type O2) in FIG. 10;

FIG. 13a illustrates a piezoelectric vibration unit 50 including a single cantilever portion 55 corresponding to type A1 depicted in FIG. 3, FIG. 13b illustrates a piezoelectric vibration unit 50 including a first-directional cantilever portion 55-1 and a second-directional cantilever portion 55-2, FIG. 13c illustrates a piezoelectric vibration unit 50 including a first-directional cantilever portion 55-1, a second-directional cantilever portion 55-2 and a third-directional cantilever portion 55-3, and FIG. 13d illustrates a piezoelectric vibration unit 50 including a first-directional cantilever portion 55-1, a second-directional cantilever portion 55-2, a third-directional cantilever portion 55-3 and a fourth-directional cantilever portion 55-4;

FIG. 19b is a sectional view taken along line S2-S2' in the supporter 80' and the piezoelectric vibration units 50(1), 50(2), 50(3) and 50(4) depicted in FIG. 19a.

DETAILED DESCRIPTION OF THE PREFERRED EMBODIMENTS

Figure 1:
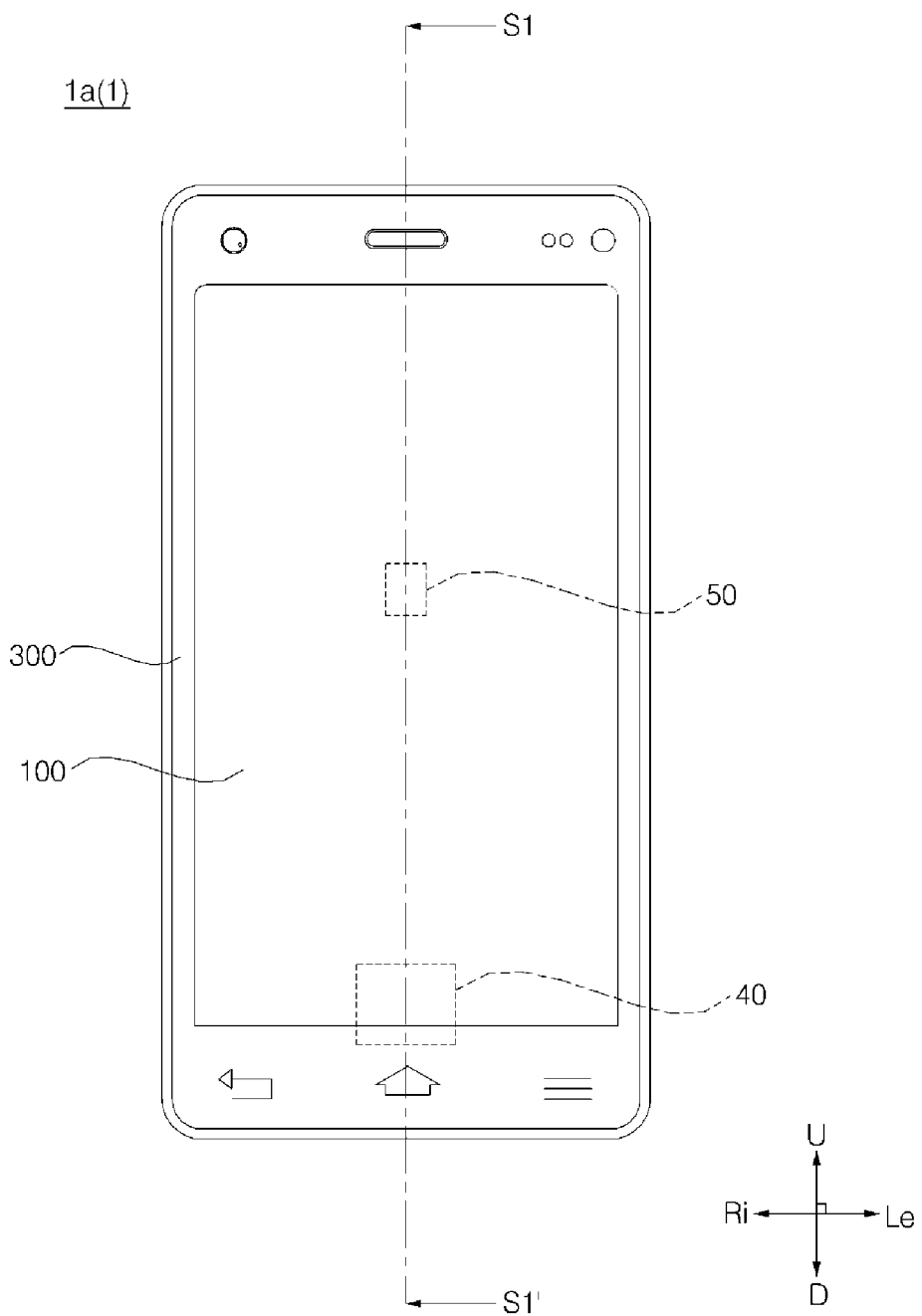
FIG. 1 is a front view of a display apparatus 1a according to one embodiment of the present invention.

Terms indicating directions such as "front (F)", "rear (R)", "left (Le)", "right (Ri)", "up (U)", and "down (D)", which will be mentioned below, are to be understood on the basis of FIGS. 1 to 8. Specifically, the terms "front" and "rear" are defined such that the direction in which a display panel 100 outputs images is defined as the front. According to this definition, in the case in which the display panel 100 is embodied as a flat display panel, like the embodiments of the present invention, the front and the rear are the same over the entire area of the display panel 100, but in the case in which the display panel 100 is embodied as a curved display panel, the front and the rear may vary. This criterion is merely for clearly explaining the present invention, and the respective directions may be defined differently depending on a change in criterion.

In addition, it will be understood that terms "first", "second", "third" and other numerical terms are used herein to describe various elements and are only used to distinguish one element from another element. Thus, these terms are irrelevant to the order, importance or master-servant relationship between the elements. For instance, an invention including only a second element, but lacking a first element, may be realized.

Referring to FIGS. 1 to 4, a display apparatus 1 according to an embodiment of the present invention comprises a display panel 100 for outputting an image in the forward direction. The display apparatus 1 comprises a piezoelectric vibration unit 50 configured to vibrate due to the piezoelectric effect. The display apparatus 1 comprises a supporter 80 or 80', which is attached to the rear surface of the display panel 100. The piezoelectric vibration unit 50 is attached to the supporter 80 or 80'. The piezoelectric vibration unit 50 includes a fixing portion 51, which is attached to the supporter 80 or 80', and a cantilever portion 55, which overhangs from the supporter 80 or 80'. The display apparatus 1 comprises a control unit 250 for controlling the image output of the display panel 100. The control unit 250 controls the vibration output of the piezoelectric vibration unit 50. The display apparatus 1 may comprise a cable 260 for transferring control signals from the control unit 250 to the display panel 100. The cable 260 may transfer the control signals from the control unit 250 to the piezoelectric vibration unit 50. The display apparatus 1 may comprise a cover 300 for defining the outer appearance of the display apparatus. The display apparatus 1 may comprise a sub-speaker 40 for outputting a sound.

Figure 2:
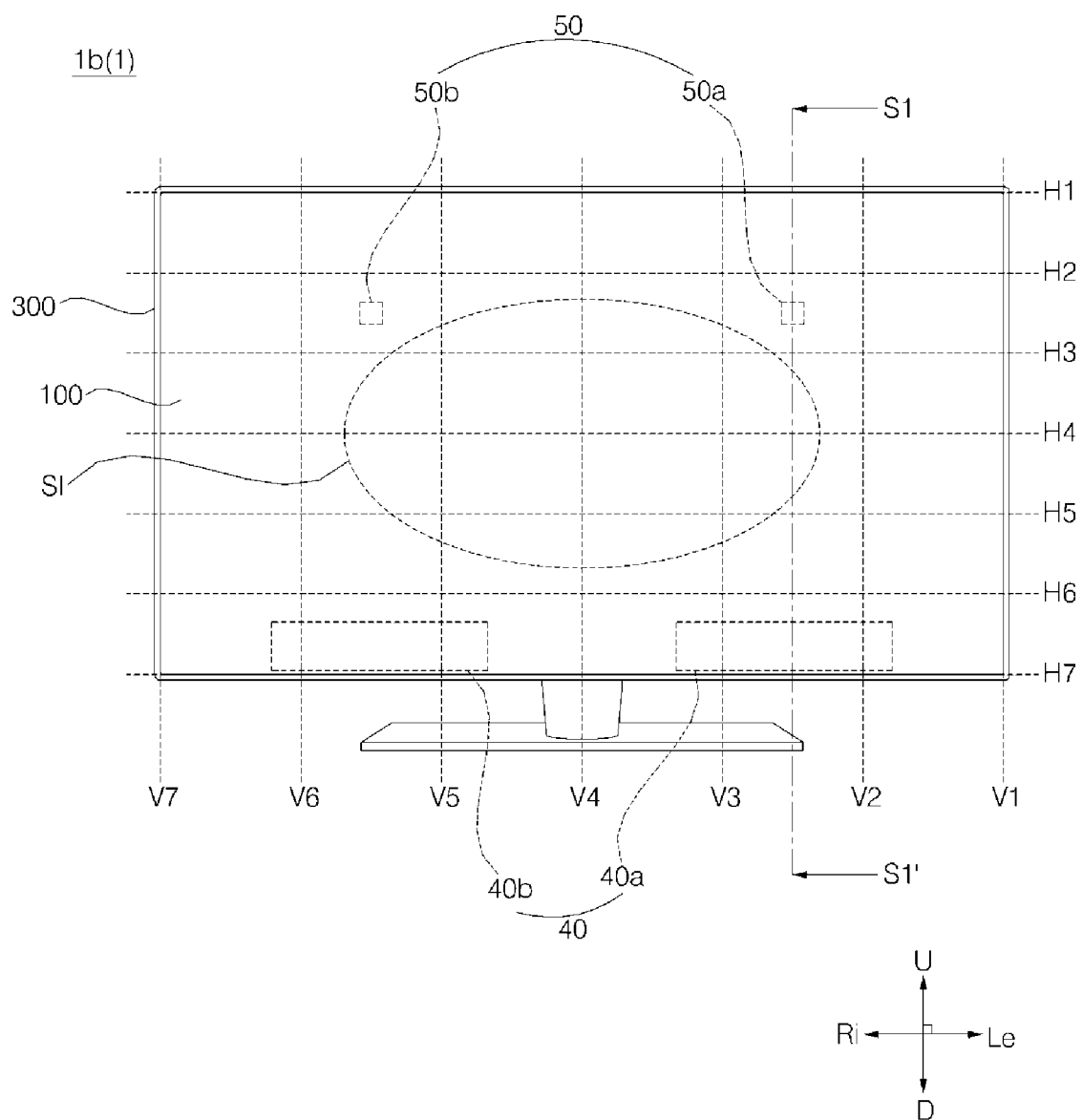
FIG. 2 is a front view of a display apparatus 1b according to another embodiment of the present invention.
Figure 4:
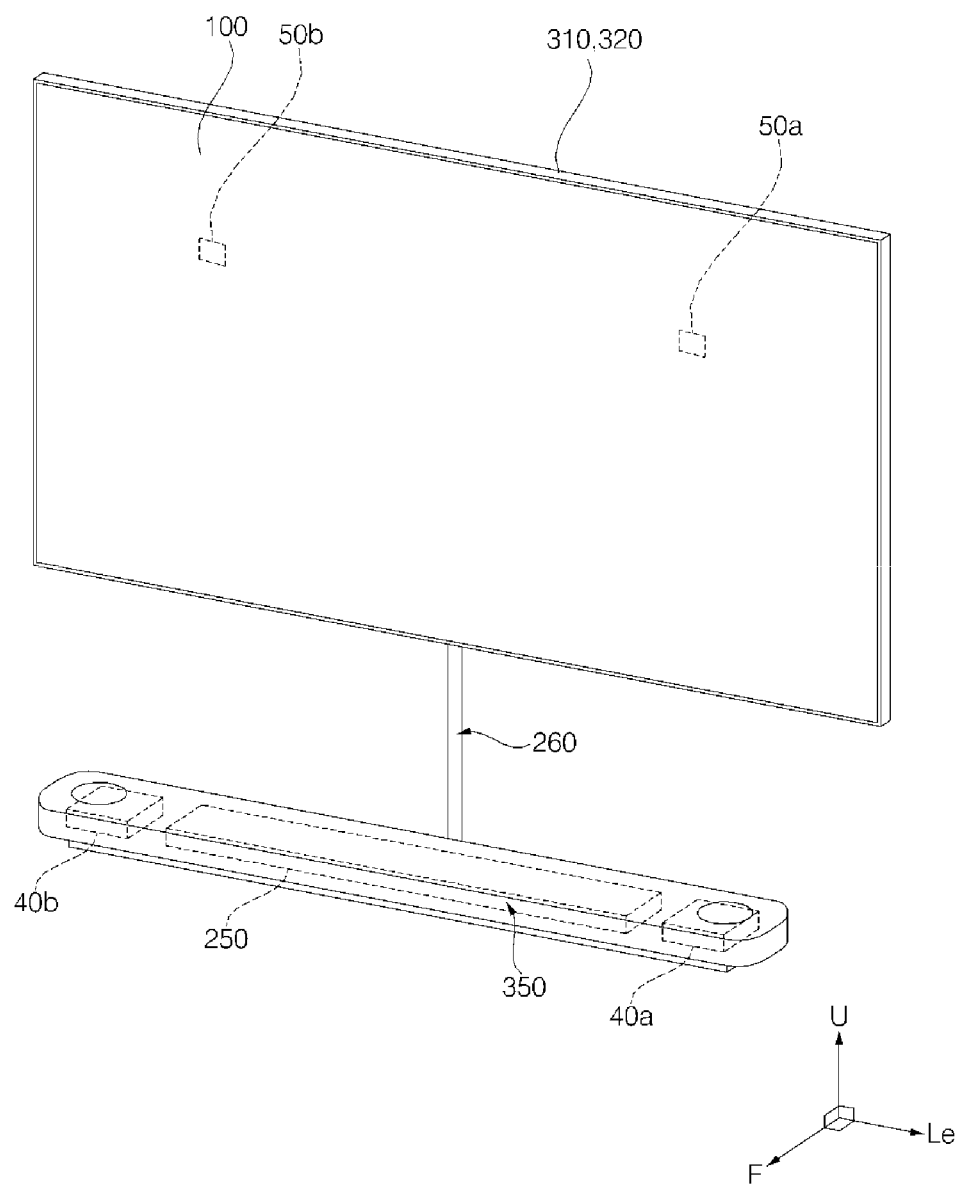
FIG. 4 is a perspective view illustrating a modified example of the display apparatus 1 depicted in FIG. 3.
Figure 5:
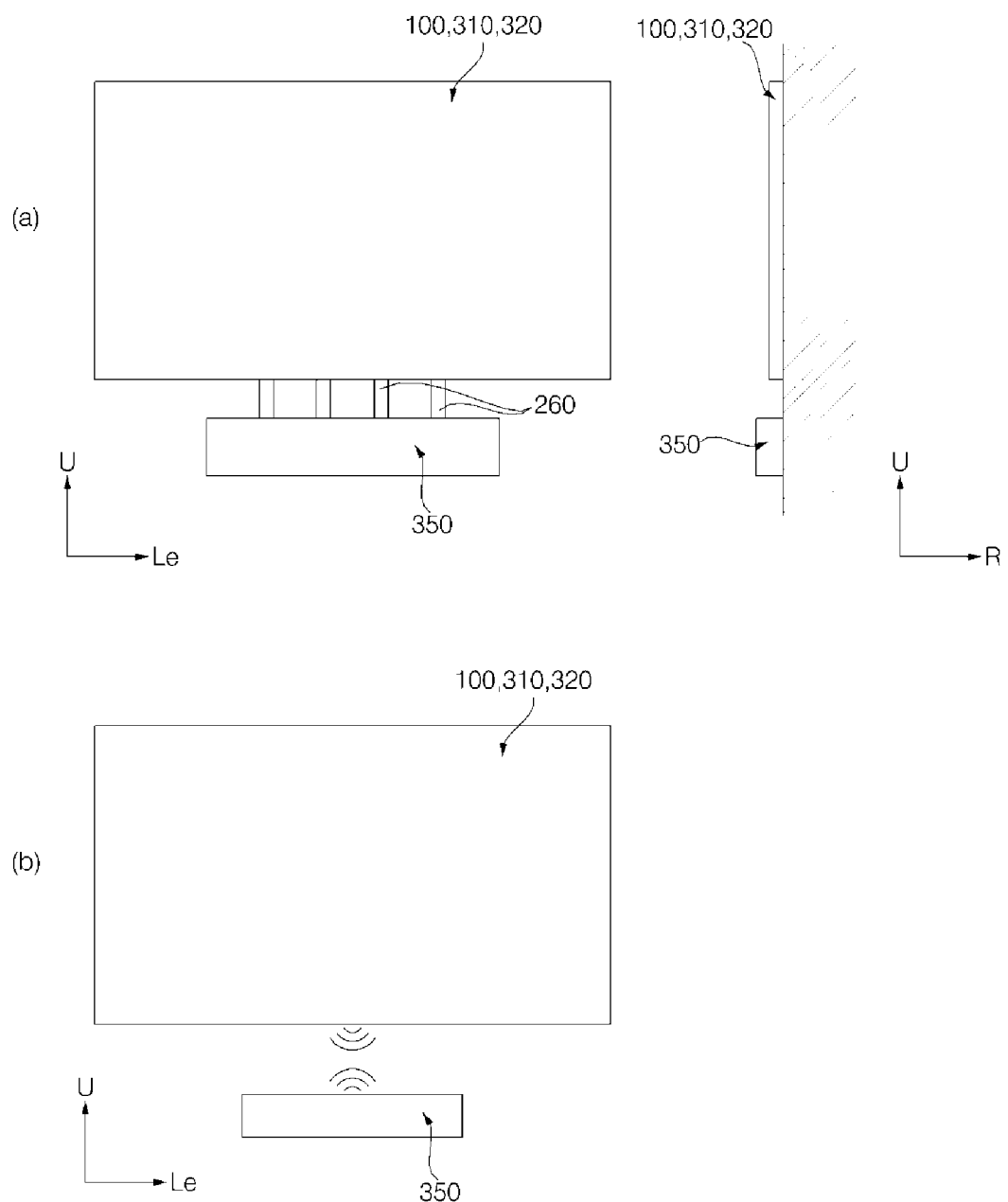
FIG. 5 illustrates views of other modified examples of the display apparatus 1 depicted in FIG. 4.

The present invention is applicable to any kind of image-output device, for example, a portable terminal device 1*a* such as a smartphone or the like, a laptop computer, a tablet PC, a monitor, a TV 1*b* and 1*b'*, etc. FIG. 1 illustrates a portable terminal device 1*a* according to one embodiment of the present invention. FIG. 2 illustrates a stand-type TV 1*b* according to another embodiment of the present invention. FIGS. 4 and 5 illustrate a wall-mounted TV 1*b'* according to a further embodiment of the present invention. Hereinafter, the present invention will be described with reference to the TV 1*b* and 1*b'*; however, the present invention is not limited thereto.

The piezoelectric vibration unit 50 according to the present invention is used to output vibration that is perceived by the sense of hearing (i.e. to output a sound) and/or to output vibration that is perceived by the sense of touch (i.e. to output a haptic effect). In an experimental example, which will be described later, the magnitude (dB) of the output sound according to the frequency is measured in order to determine the output of the piezoelectric vibration unit 50 depending on the frequency, and the experimental result may also be identically derived from the piezoelectric vibration unit 50 for the haptic effect. Although the present invention will be described with reference to the piezoelectric vibration unit 50 for outputting sound, the purpose of the piezoelectric vibration unit 50 is not limited to sound output.

The cover 300 according to this embodiment supports a marginal portion of the display panel 100 and covers the rear surface of the display panel 100. However, in another embodiment (not shown), a folding-type display apparatus 1, in which a flexible display panel 100 is provided without being supported by the cover 300 and in which at least a portion of the rear surface of the display panel 100 is exposed, may be realized.

The display apparatus 1*a* (e.g. a tablet PC, a smartphone or the like) according to one embodiment of the present invention will now be described in detail with reference to FIGS. 1 and 3. The display apparatus 1*a* comprises a display panel 100, which is formed such that a height thereof in the vertical direction is greater than a width thereof in the lateral direction. Specifically, the display panel 100 is formed in a quadrangular shape having four sides, two relatively short sides of which are arranged to define the top and bottom sides of the display panel and two relatively long sides of which are arranged to define the left and right sides of the display panel. A piezoelectric vibration unit 50 is attached to the center portion of the rear surface of the display panel 100. There is further provided a cover 300 for covering the rear surface of the display panel 100. The cover 300 supports the marginal portion of the display panel 100. The cover 300 forms an internal space therein, and a sub-speaker 40 for outputting a sound is disposed in the internal space. The piezoelectric vibration unit 50 directly vibrates the display panel 100. When a user touches the front surface of the display panel 100, the piezoelectric vibration unit 50 may generate vibration, and the generated vibration may be transferred to the user's fingertips via the display panel 100. As a result of the piezoelectric vibration unit 50 being attached to the rear surface of the display panel 100, the magnitude of the output vibration that is transferred to the user's one hand, which is in contact with the display panel 100, is larger than the magnitude of the output vibration that is transferred to the other hand, which is in contact with the cover 300.

The display apparatus 1*b* (e.g. a TV, a monitor or the like) according to another embodiment of the present invention will now be described in detail with reference to FIGS. 2 and 3. The display apparatus 1*b* comprises a display panel 100, which is formed such that a width thereof in the lateral direction is greater than a height thereof in the vertical direction. Specifically, the display panel 100 is formed in a quadrangular shape having four sides, two relatively short sides of which are arranged to define the left and right sides of the display panel and two relatively long sides of which are arranged to define the top and bottom sides of the display panel. At least one piezoelectric vibration unit 50 generates a sound by directly vibrating the display panel 100. In order to output stereo sound, the at least one piezoelectric vibration unit 50 includes two piezoelectric vibration units 50*a* and 50*b*, which are spaced apart from each other and are attached to the rear surface of the display panel 100. There is further provided a cover 300 for covering the rear surface of the display panel 100. The cover 300 supports the marginal portion of the display panel 100. The cover 300 forms an internal space therein, and at least one sub-speaker 40 for outputting a sound may be disposed in the internal space. The at least one sub-speaker 40 may include two sub-speakers 40, which are spaced apart from each other in the lateral direction in order to output stereo sound, and the sub-speakers 40 may be embodied as woofers or the like. As a result of the piezoelectric vibration unit 50 being attached to the rear surface of the display panel 100, the position of the image and the position SI of the output sound (a sound image), which the user perceives from the display panel 100, are substantially identical to each other.

The piezoelectric vibration unit 50 may be provided to generate haptic vibration; however, the piezoelectric vibration unit configured to vibrate for sound output will now be described. Referring to FIG. 3, the piezoelectric vibration unit 50 propagates sound in the forward direction (refer to arrow Sa). The sub-speaker 40 may propagate sound in any one direction among upper, lower, left and right directions (refer to arrow Sb). In this embodiment, the sub-speaker 40 propagates sound in the lower direction.

Figure 3:
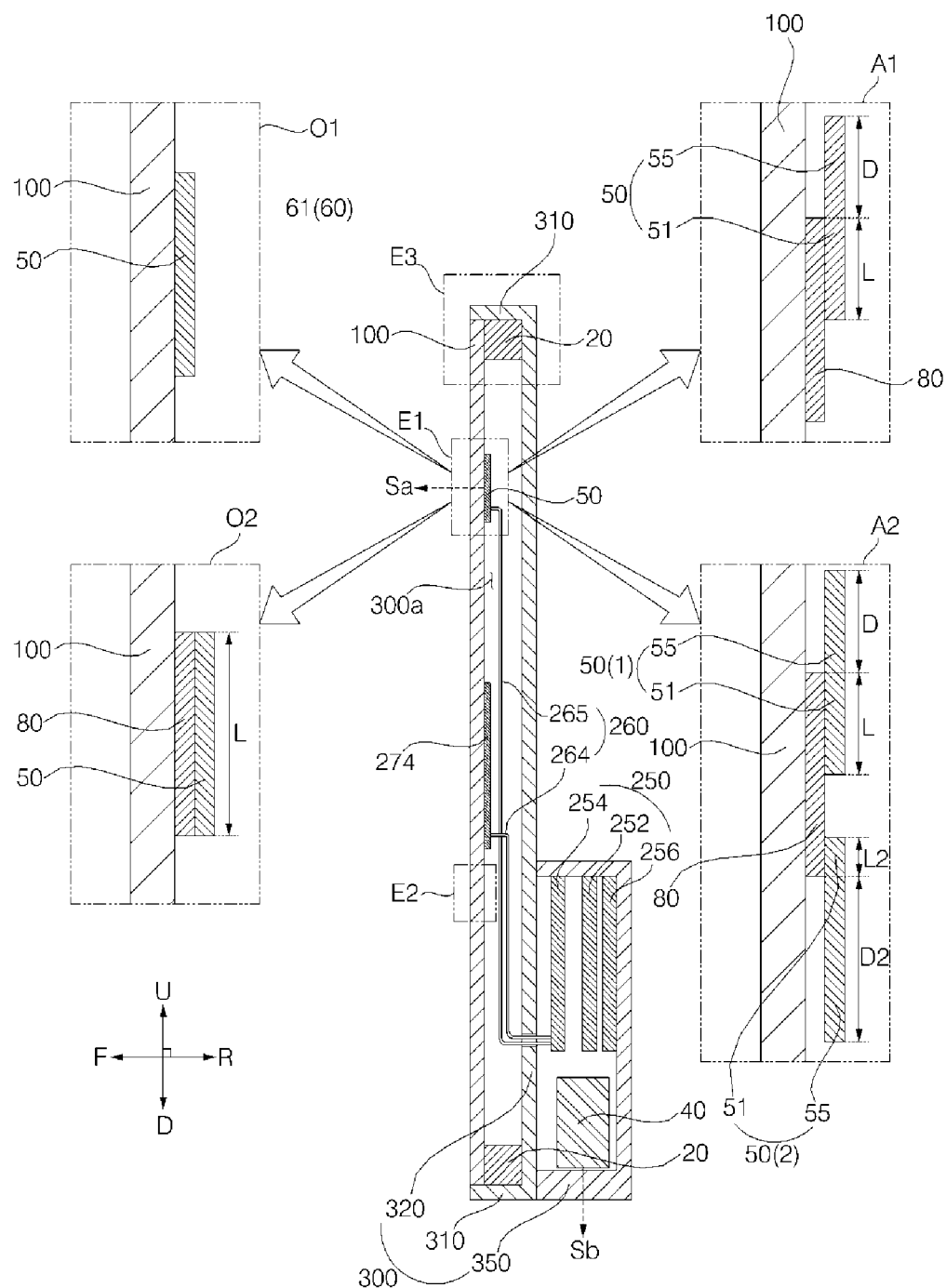
FIG. 3 is a sectional view taken along line S1-S1' of the display apparatus 1 depicted in FIGS. 1 and 2, in which enlarged sectional views of portion E1 are illustrated in accordance with type O1, type O2, type A1 and type A2.
Figure 7:
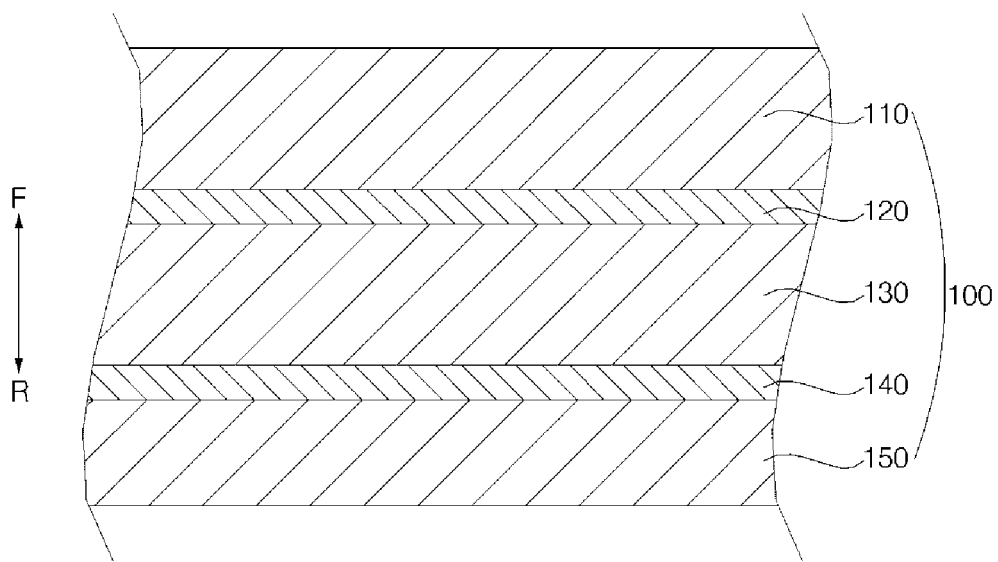
FIG. 7 is an enlarged sectional view of portion E2 depicted in FIG. 3.
Figure 8:
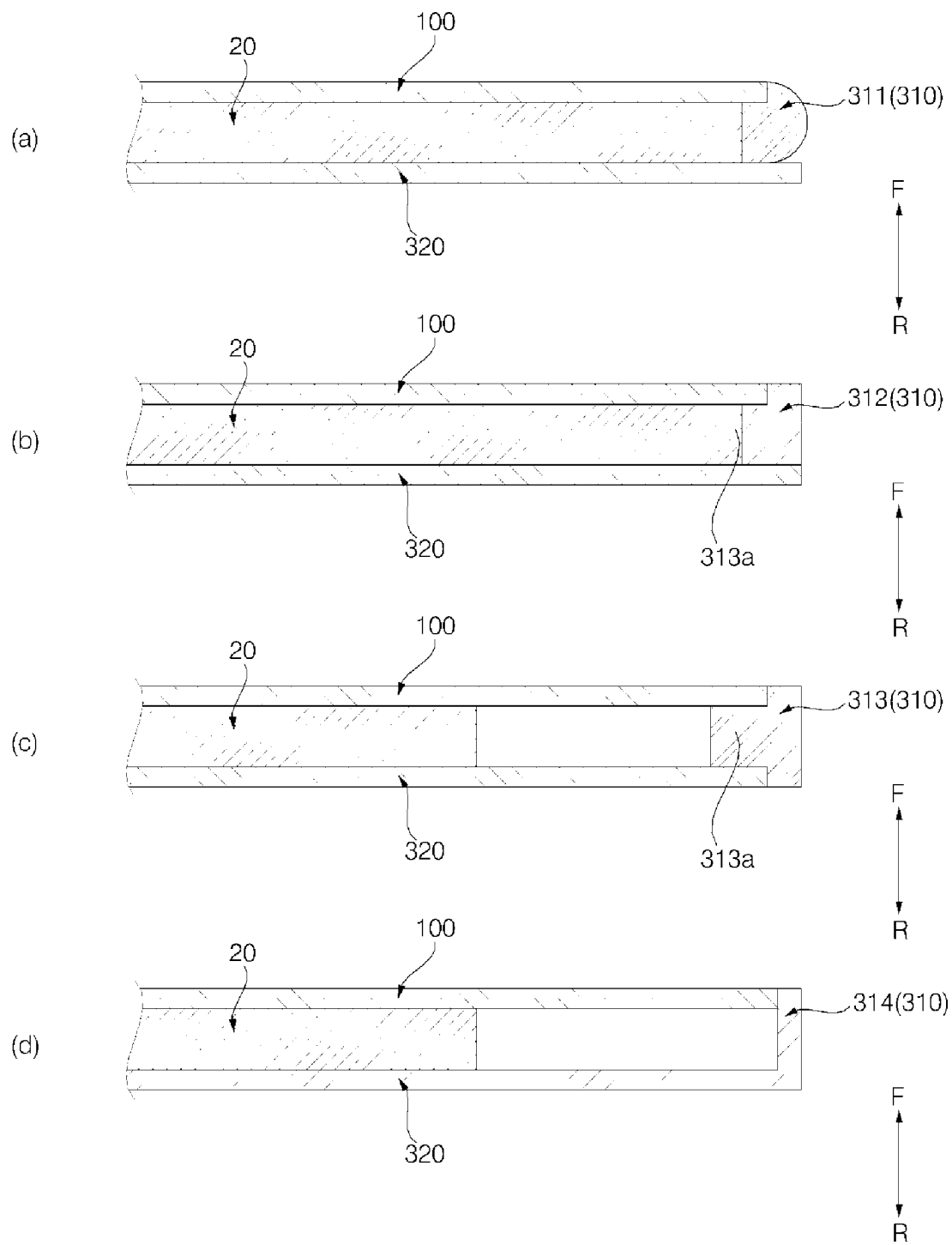
FIG. 8 is an enlarged sectional view of portion E3 depicted in FIG. 3.

Referring to FIGS. 3 and 7, the display panel 100 may be embodied as a plasma display panel (PDP), a field emission display (FED), a liquid crystal display (LCD), or an organic light-emitting diode (OLED) display. The OLED display panel is advantageous with regard to direct vibration due to its thin and flexible properties, and is also advantageous in attachment of the piezoelectric vibration unit 50 to the rear surface thereof because it does not need a backlight module. From this point of view, it is preferable for the display panel 100 to be an OLED display panel 100; however, the invention is not limited thereto.

The embodiment of the OLED display panel 100 will now be described in detail with reference to FIG. 7. The display panel 100 may include an upper cover layer 110, an upper electrode 120, an organic light-emitting layer 130, a lower electrode 140 and a lower cover layer 150. The upper cover layer 110, the upper electrode 120, the organic light-emitting layer 130, the lower electrode 140 and the lower cover layer 150 may be sequentially disposed from the front to the rear.

The upper cover layer 110 and the upper electrode 120 may include a transparent material. The upper cover layer 110 may be formed of a glass material having a thickness of 0.7 mm. The upper cover layer 110 may be formed of a transparent thin film. The upper electrode 120 may be a cathode, and the lower electrode 140 may be an anode. The lower electrode 140 may include a non-transparent material; however, the embodiment is not limited thereto, and the lower electrode 140 may alternatively include a transparent material (e.g. ITO, etc.). In this case, light may be radiated to one surface of the lower electrode 140. When a voltage is applied to the upper and lower electrodes 120 and 140, the light emitted from the organic light-emitting layer 130 may pass through the upper electrode 120 and the upper cover layer 110 and may be radiated outside. An OLED display panel 100 may include a light-shielding plate positioned in the rear surface of the lower electrode 140. An electron transfer layer (ETL) (not shown) may be disposed between the organic light-emitting layer 130 and the upper electrode 120. A hole transfer layer (HTL) (not shown) may be disposed between the organic light-emitting layer 130 and the lower electrode 140. The lower cover layer 150 may be formed of an invar material having a thickness of 0.1 mm. The lower cover layer 150 may be formed of a glass material. A thin film transistor (TFT) (not shown) may be disposed between the lower electrode 140 and the lower cover layer 150.

Referring to FIG. 3, the display apparatus 1 comprises a cover 300 for supporting the marginal portion of the display panel 100. The cover 300 is spaced apart from the rear surface of the display panel 100 so as to form a space 300a between the cover 300 and the display panel 100. The piezoelectric vibration unit 50 is disposed in the space 300a. The cover 300 includes a side cover 310, which extends along the periphery of the display panel 100. The cover 300 includes a back cover 320 for covering the rear surface of the display panel 100. The cover 300 includes a housing 350, which has therein a space for accommodating at least a portion of the control unit 250. The housing 350 may accommodate the sub-speaker 40.

An adhesive sheet 20 is disposed between the rear surface of the display panel 100 and the front surface of the back cover 320. The display panel 100 may be attached to the back cover 320 by means of the adhesive sheet 20. The adhesive sheet 20 may include a piece of double-sided tape, to both sides of which objects can be adhered. The rear surface of the display panel 100 is adhered to the front surface of the adhesive sheet 20. The rear surface of the adhesive sheet 20 is adhered to the front surface of the back cover 320. The display panel 100 and the back cover 320 are spaced apart from each other by the adhesive sheet 20.

The side cover 310 extends along at least one of the four sides of the display panel 100, i.e. the upper, lower, left and right sides thereof. In this embodiment, the side cover 310 is disposed to surround all four sides of the display panel 100. The side cover 310 may be disposed in contact with the periphery of the display panel 100. The side cover 310 functions to seal a gap between the periphery of the display panel 100 and the periphery of the back cover 320.

A side cover 311, according to the first embodiment illustrated in FIG. 8a, may be supported by hardening a semisolid sealing material. The side cover 311 may be attached to one surface of the adhesive sheet 20 along the periphery of the display panel 100 in a sealed manner. The sealing material is hardened in the state of being in contact with the periphery of the display panel 100, the periphery of the back cover 320 and the one surface of the adhesive sheet 20, with the result that the side cover 311 is securely supported.

A side cover 312, according to the second embodiment illustrated in FIG. 8b, may be fixedly inserted into a gap between the rear surface of the display panel 100 and the front surface of the back cover 320. The side cover 312 is disposed in contact with one surface of the adhesive sheet 20. One end of the side cover 312 is in contact with the one surface of the adhesive sheet 20, and the other end of the side cover 312 is bent in the forward direction. The side end of the display panel 100 is shielded by the side cover 312. The side end of the display panel 100 may be in contact with the side cover 312.

A side cover 313, according to the third embodiment illustrated in FIG. 8c, may be fixedly inserted into a gap between the rear surface of the display panel 100 and the front surface of the back cover 320. The side cover 313 is disposed so as to be spaced apart from one surface of the adhesive sheet 20. The side cover 313 includes an insertion portion 313a, which is inserted into a gap between the rear surface of the display panel 100 and the front surface of the back cover 320. A portion of the side cover 313 protrudes from the insertion portion 313a in the forward direction and shields the side end of the display panel 100. The side end of the display panel 100 may be in contact with the side cover 313. A portion of the side cover 313 protrudes from the insertion portion 313a in the backward direction and shields the side end of the back cover 320. The side end of the back cover 320 may be in contact with the side cover 313.

A side cover 314, according to a fourth embodiment illustrated in FIG. 8d, is integrally formed with the back cover 320. The peripheral portion of the back cover 320 is bent in the forward direction and serves as the side cover 314. That is, the side cover 314 protrudes from the back cover 320 in the forward direction. The side cover 314 shields the side end of the display panel 100. The side end of the display panel 100 may be in contact with the side cover 314.

The housing 350 accommodates the control unit 250. The control unit 250 includes a main circuit board 252 for processing various control signals. The control unit 250 includes a control board 254 for controlling image output. The main circuit board 252 or the control board 254 may control the vibration output of the piezoelectric vibration unit 50, or there may be provided an additional vibration control board (not shown) for controlling the vibration output of the piezoelectric vibration unit 50. The control unit 250 includes a power supply unit 256 for distributing power to the respective components of the display apparatus 1. The power supply unit 256 may supply power to the display panel 100. The power supply unit 256 may supply power to the piezoelectric vibration unit 50. The power supply unit 256 may receive and store external power.

In the case of a display apparatus 1 including a plurality of piezoelectric vibration units 50, the control unit 250 may perform control such that electric energy is selectively applied to the piezoelectric vibration units 50. The control unit 250 may perform control such that electric energy is selectively applied to the first to $n^{th}$ piezoelectric vibration units 50(1) to 50(n) (where n is a natural number of 2 or more). The control unit 250 may perform control such that one or more piezoelectric vibration units selected from among the first to $n^{th}$ piezoelectric vibration units 50(1) to 50(n) perform output operation. The control unit 250 may perform control such that only any one of the first to $n^{th}$ piezoelectric vibration units 50(1) to 50(n) performs output operation or may perform control such that all of the first to $n^{th}$ piezoelectric vibration units 50(1) to 50(n) perform output operation at the same time. In the case in which each of the piezoelectric vibration units 50 includes a cantilever portion 55 having an overhanging length D different from the others, it is possible to selectively realize amplification in a plurality of predetermined sub-ranges in the low frequency range.

In the case of a display apparatus 1 including the first and second piezoelectric vibration units 50(1) and 50(2), the control unit 250 may perform control such that electric energy is selectively applied to the first piezoelectric vibration unit 50(1) and the second piezoelectric vibration unit 50(2). The control unit 250 may perform control such that only the first piezoelectric vibration unit 50(1) performs output operation, such that only the second piezoelectric vibration unit 50(2) performs output operation, or such that both the first piezoelectric vibration unit 50(1) and the second piezoelectric vibration unit 50(2) perform output operation. In the case in which the first cantilever portion 55 of the first piezoelectric vibration unit 50(1) has a first overhanging length D1 and the second cantilever portion 55 of the second piezoelectric vibration unit 50(2) has a second overhanging length D2, which is different from the first overhanging length D1, it is possible to selectively realize amplification in two predetermined sub-ranges in the low frequency range.

The display apparatus 1 may comprise a cable 260 for transferring control signals from the control unit 250 to the respective components. The cable 260 includes a plurality of conductive wires. The cable 260 may be provided in a plural number. The cable 260 may be embodied as a flat cable having a flat shape, or may be embodied as a circular cable having a circular-shaped cross-section. The cable 260 may include a plurality of signal-connecting terminal pins and at least one ground terminal pin.

The cable 260 includes an image signal transfer wire 264 for transferring image output signals to the display panel 100. One end of the image signal transfer wire 264 is connected to the control board 254, and the other end of the image signal transfer wire 264 is connected to an interface PCB 274 disposed at the display panel 100.

The cable 260 includes a vibration signal transfer wire 265 for transferring a vibration output signal to the piezoelectric vibration unit 50. One end of the vibration signal transfer wire 265 is connected to the control board 254, and the other end of the vibration signal transfer wire 265 is connected to the piezoelectric vibration unit 50. Two vibration signal transfer wires 265 for the supply of voltage may be used for one piezoelectric vibration unit 50. In order to selectively control the first to $n^{th}$ piezoelectric vibration units 50(1) to 50(n), there may be provided vibration signal transfer wires 265, the number of which is 2n (where n is a natural number of 2 or more). For instance, four vibration signal transfer wires 265 may be provided to control two piezoelectric vibration units 50.

In the embodiment illustrated in FIG. 3, the housing 350 may be provided so as to be coupled with the back cover 320. In this case, the housing 350 may be coupled to a lower portion of the rear surface of the back cover 320. The cable 260 is disposed in the internal space in the housing 350 and in the internal space 300a in the back cover.

In the wall-mounted display apparatus 1b' according to the embodiment illustrated in FIG. 4, the housing 350 may be provided so as to be separate from the back cover 320. The cable 260 for electrically connecting the control unit 250 in the housing 350 and the display unit 100 and 50 is exposed outside. The cable 260 may be embodied such that a plurality of conductive wires is formed into a bundle.

In the wall-mounted display apparatus 1b' according to a modified embodiment illustrated in FIG. 5a, cables 260, which are divided into a plurality of bundles, are provided. As shown in FIG. 5a, four cables 260 are exposed.

In the wall-mounted display apparatus 1b' according to another modified embodiment illustrated in FIG. 5b, the control unit 250 may be configured to transfer control signals to the display unit 100 and 50 in a wireless manner. In this case, it is possible to realize a display apparatus 1b' without a cable 260 for electrically connecting the housing 350 and the display unit 100 and 50.

Figure 6:
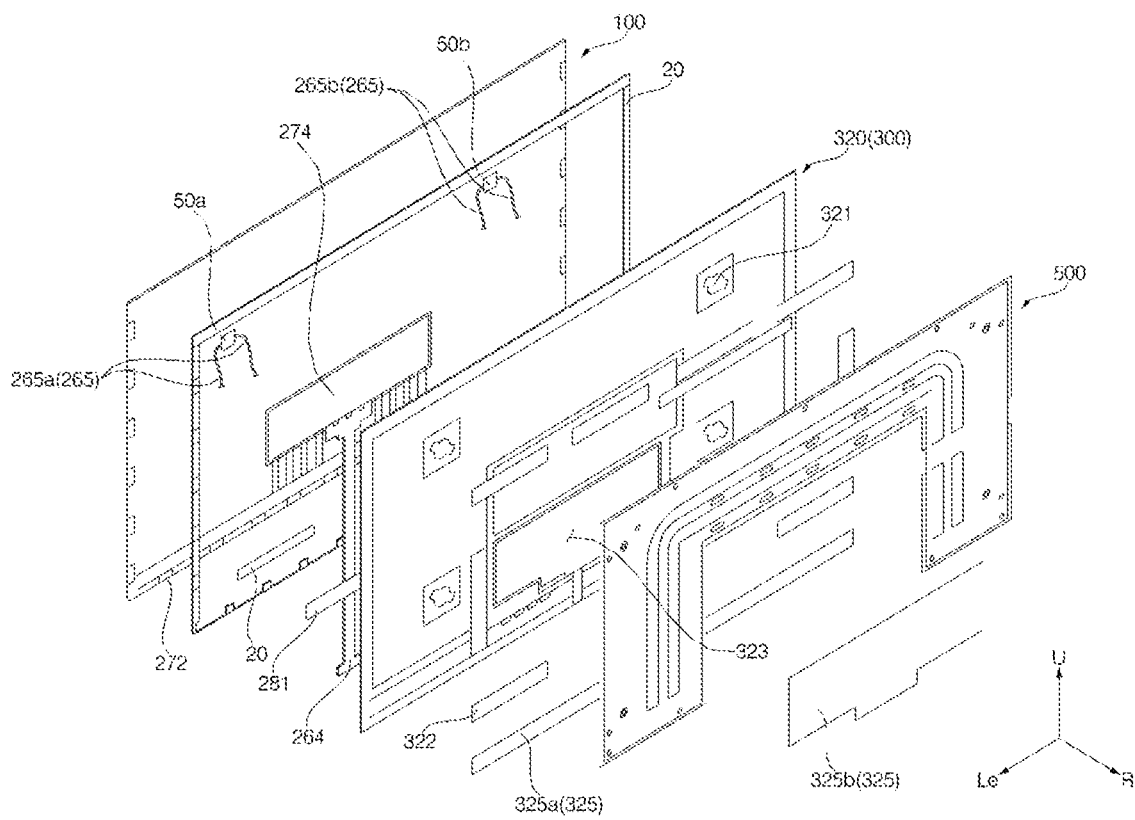
FIG. 6 is an exploded perspective view of the display apparatus 1 depicted in FIG. 4, in which illustration of a housing 350 is omitted.

The components, which are disposed in the display panel 100 and/or the cover 300, will now be described in detail with reference to FIG. 6.

An interface PCB 274 and at least one source PCB 272 may be positioned on at least a portion of the rear surface of the display panel 100. The interface PCB 274 may be positioned above the at least one source PCB 272. The at least one source PCB 272 may be electrically connected to the interface PCB 274. The at least one source PCB 272 may include a plurality of source PCBs 272. The plurality of source PCBs 272 may be spaced apart from each other.

The interface PCB 274 may include signal wiring for transferring digital video data and timing control signals transmitted from the control board 254.

The source PCB 272 may apply the voltage to the display panel 100 in response to the signals transferred from the interface PCB 274. The source PCB 272 may apply the drive waveform to the display panel 100 in response to the image signals.

The source PCB 272 may be electrically connected to the display panel 100 by a source COF (Chip on Flexible Printed Circuit) (not shown). The source COF, which is connected with a portion of the source PCB 272, may be connected to a lower end of the display panel 100. The source COF may be electrically connected to the source PCB 272 and the TFT of the display panel 100. A data integrated circuit may be mounted as the source COF.

The adhesive sheet 20 for coupling the display panel 100 and the back cover 320 is positioned on the rear surface of the display panel 100. The adhesive sheet 20 may be formed to have a quadrangular frame shape, which forms a space surrounded thereby. At least one PCB may be positioned in the space 300a surrounded by the adhesive sheet 20. One surface of the adhesive sheet 20 may be coupled to the display panel 100, and the opposite surface of the adhesive sheet 20 may be coupled to the back cover 320.

An insulating sheet 281 may be provided at a portion corresponding to the position of the source PCB 272. The insulating sheet 281 may be attached to the front surface of the back cover 320. The insulating sheet 281 may include an insulating material for preventing the source PCB 272 from being influenced by other electronic devices.

The back cover 320 is disposed behind the display panel 100. The back cover 320 may be attached to the display panel 100 by means of the adhesive sheet 20. The back cover 320 may function to support the rear surface of the display panel 100. The back cover 320 may include an aluminum material.

The thickness of the marginal portion of the back cover 320 in the front-rear direction may be greater than the thickness of the remaining portion of the back cover 320 in the front-rear direction. The marginal portion of the back cover 320 may protrude backwards. When the back cover 320 is coupled to a wall bracket 500, the protruding marginal portion of the back cover 320 covers the marginal portion of the wall bracket 500. The wall bracket 500 is a member that is secured to a wall in order to support the display apparatus 1.

The back cover 320 has coupling holes 321 formed at positions near the four corners thereof. The coupling holes 321 may be formed through the back cover 320. The coupling holes 321 may be formed in the rear surface of the back cover 320. The portion of the back cover 320 in which each of the coupling holes 321 is located may be formed so as to protrude further backwards than the remaining portion. The coupling holes 321 function to detachably couple the wall bracket 500 and the cover 300.

The back cover 320 includes coupling portions 322 disposed in the marginal portion thereof. The coupling portions 322 may be disposed along at least one of the four sides of the back cover 320. The coupling portions 322 may be formed so as to protrude from the back cover 320 in the backward direction. The rear surface of the portion of the back cover 320 in which the coupling portions 322 are disposed and the rear surface of the portion of the back cover 320 in which the coupling holes 321 are formed may lie in substantially the same plane. The coupling portions 322 may include a material having magnetic properties. When the cover 300 is coupled to the wall bracket 500, the coupling force becomes stronger due to the magnetic properties of the coupling portions 322.

The back cover 320 has an opening 323 formed in a portion that corresponds to the position of the interface PCB when the display panel 100 and the cover 300 are coupled to each other. The opening 323 is located in the middle of the back cover 320. The opening 323 is disposed behind the interface PCB 274. The thickness of the interface PCB 274 in the front-rear direction may be greater than the thickness of the space 300a between the back cover 320 and the display panel 100 in the front-rear direction, and the opening 323 provides a space in which the interface PCB 274 is located.

There are further provided PCB covers 325, which are disposed behind the PCBs 272 and 274 secured to the rear surface of the display panel 100. The PCB covers 325 may be coupled to the back cover 320. The PCB covers 325 may include a first PCB cover 325a and a second PCB cover 325b. The first PCB cover 325a is located at a portion corresponding to the position of the source PCB 272. The second PCB cover 325b is located at a portion corresponding to the position of the interface PCB 274. The second PCB cover 325b may cover the opening 323. The PCB covers 325 may prevent the source PCB 272 and the interface PCB 274 from being exposed outside.

The arrangement position and the sound image SI of the piezoelectric vibration unit 50 will now be described with reference to FIG. 2. The display panel 100 may be formed such that a width thereof in the lateral direction is greater than a height thereof in the vertical direction. The display apparatus 1 may include at least two piezoelectric vibration units 50a and 50b, which are arranged so as to be spaced apart from each other.

On the assumption that the entire region of the display panel 100 is equally divided into six columns (six imaginary sections divided by V1, V2, V3, V4, V5, V6 and V7), one 50a of the two piezoelectric vibration units 50a and 50b is located in the second column from the left, and the other one 50b is located in the second column from the right. Further, on the assumption that the entire region of the display panel 100 is equally divided into six rows (six imaginary sections divided by H1, H2, H3, H4, H5, H6 and H7), the two piezoelectric vibration units 50a and 50b are located in the second row from the top. As a result, the sound image SI generated by the two piezoelectric vibration units 50a and 50b may be located at the center portion of the display panel 100.

The separation distance between two random piezoelectric vibration units 50a and 50b from among the plurality of piezoelectric vibration units 50 is set to a value such that destructive interference between the predetermined ranges of low frequencies generated by the two piezoelectric vibration units 50a and 50b is avoided. To this end, the separation distance d between the two piezoelectric vibration units 50a and 50b may be set to be greater than 0 and less than a first predetermined distance d1 that is derived from the following equation 1, or may be set to be greater than a second predetermined distance d2 that is derived from the following equation 2 and less than the diagonal length of the front surface of the display panel 100.

$$d1 = (4 \times c)/f2 \qquad \text{[Equation 1]}$$

$$d2 = (4 \times c)/f1 \qquad \text{[Equation 2]}$$

Here, c refers to the speed of sound, f1 refers to the minimum boundary value of the predetermined low frequency range, and f2 refers to the maximum boundary value of the predetermined low frequency range. Although the speed of sound c varies depending on the temperature, the first predetermined distance d1 and the second predetermined distance d2 may be set on the assumption that the speed of sound is 340 m/s, which is a value at room temperature. The predetermined low frequency range may be regarded as being from 100 Hz to 800 Hz, which is equivalent to the frequency range of the human voice, and, in this case, f1 is set to 100 Hz and f2 is set to 800 Hz.

Although not illustrated in FIG. 2, the display apparatus 1 may include a first supporter 80 and a second supporter 80, which is spaced apart from the first supporter 80. Each of the first piezoelectric vibration unit 50a and the second piezoelectric vibration unit 50b, which are spaced apart from each other, may be attached to a respective one of the first supporter 80 and the second supporter 80. In this case, the first piezoelectric vibration unit 50a includes a first fixing portion 51, which is attached to the first supporter 80, and a first cantilever portion 55, which extends from the first fixing portion 51 by a first overhanging length D1. The second piezoelectric vibration unit 50b includes a second fixing portion 51, which is attached to the second supporter 80, and a second cantilever portion 55, which extends from the second fixing portion 51 by a second overhanging length D2. The first overhanging length D1 and the second overhanging length D2 may be different from each other. Accordingly, it is possible to realize amplification in two predetermined sub-ranges in the low frequency range.

Hereinafter, the constructions in accordance with the overhanging lengths D of the cantilever portions 55 or the number of cantilever portions 55 and the experimental results thereof will be described in detail. Further, experimental data for verifying the effects of the respective constructions will be provided.

FIG. 3 illustrates enlarged sectional views of various modifications (type O1, type O2, type A1 and type A2) of portion E1. The piezoelectric vibration unit 50 is disposed behind the display panel 100. Type O1 refers to a reference construction in which only the piezoelectric vibration unit 50 is attached to the rear surface of the display panel 100 without a supporter 80. Type O2 refers to another reference construction in which the entire surface of the piezoelectric vibration unit 50 is attached to the supporter 80 without a cantilever portion 55. Type O1 and type O2 are comparative examples for verifying the effects of the cantilever portion 55. Type A1 refers to an experimental group in which a single piezoelectric vibration unit 50 includes a cantilever portion 55 having a predetermined overhanging length D. Type A2 refers to an experimental group in which a plurality of piezoelectric vibration units 50 includes respective cantilever portions 55 having predetermined overhanging lengths D1 and D2.

FIGS. 9, 10, 11a to 11e and 12 illustrate log-scale graphs showing experimental examples of measuring the magnitudes (dB) of the output in accordance with the respective frequency ranges (Hz) generated when predetermined voltages are applied to the piezoelectric vibration unit 50. Each graph has an X-Y coordinate system, in which the X-axis represents a magnitude (Hz) of the frequency and the Y-axis represents a magnitude (dB) of the vibration output.

Figure 9:
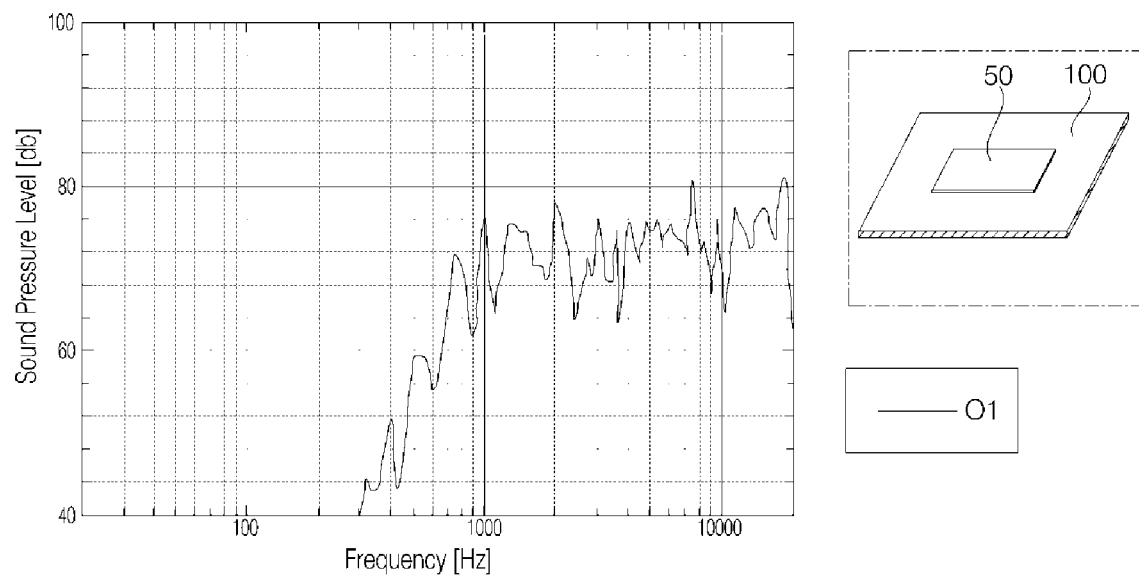
FIGS. 9, 10, 11a to 11e and 12 illustrate log-scale graphs showing experimental examples of measuring magnitudes (dB) of output in accordance with respective frequency ranges (Hz) generated when predetermined voltages are applied to a piezoelectric vibration unit 50.
Figure 10:
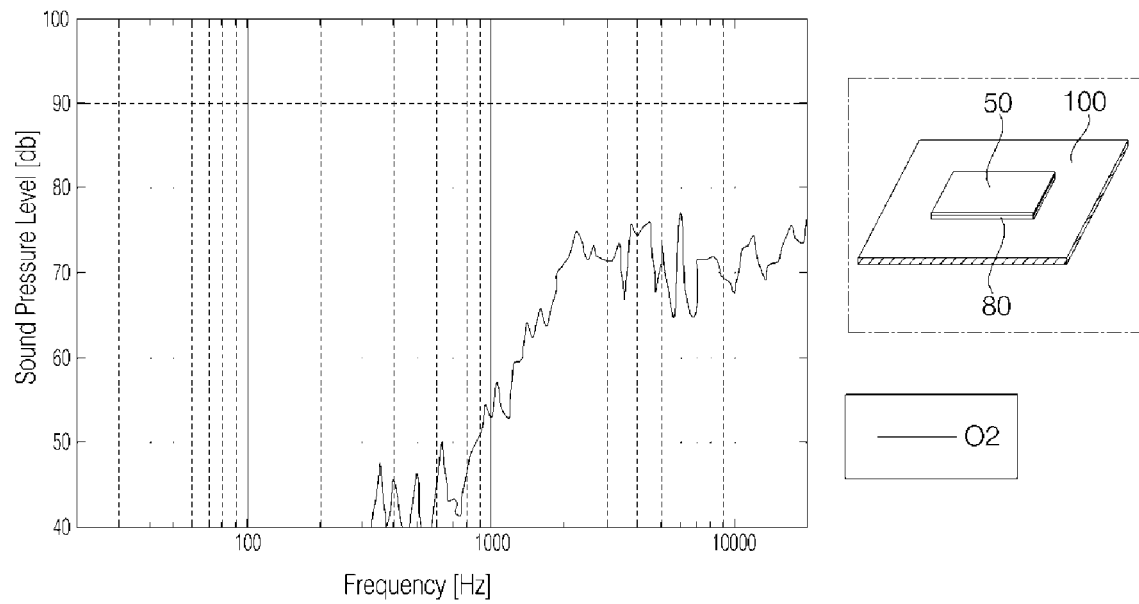

FIGS. 9 and 10 illustrate perspective views, each showing the portion in which the piezoelectric vibration unit 50 in accordance with type O1 or type O2 is disposed, near the right upper corner of each graph. The experimental result of the piezoelectric vibration unit 50 illustrated in each perspective view is represented by the corresponding graph.

FIGS. 11a to 11e and 12 illustrate perspective views, each showing the portion in which the piezoelectric vibration unit 50 in accordance with type A1 or type A2 is disposed, near the right upper corner of each graph. The experimental result of the experimental group having the construction illustrated in each perspective view is represented by the corresponding graph. In FIGS. 11a to 11e and 12, the graph of type O2 is illustrated together with the graph of the corresponding experimental group. An auxiliary box for discrimination between the graph line of type O2 and the graph line of the corresponding experimental group is illustrated near the right lower corner of each graph. The value (mm) of the overhanging length D of the cantilever portion 55 of the corresponding experimental group is described in the auxiliary box. The value (mm) of the first overhanging length D1 of the first cantilever portion 55(1) and the value (mm) of the second overhanging length D2 of the second cantilever portion 55(2) are described in the auxiliary box in FIG. 12.

The piezoelectric vibration unit 50 used for the experiments proposed in this disclosure is formed by stacking sixteen layers of a PZT material such that electricity flows in the stacked layers in a zigzag manner. The piezoelectric vibration unit 50 used for the experiments proposed in this disclosure is formed in a rectangular shape having a size of about 40 mm×about 30 mm when seen from rear side and a thickness of about 0.8 mm in the front-rear direction. The display panel used for the experiments is a 65-inch OLED display panel.

The piezoelectric vibration unit 50 is formed in a rectangular shape when seen from rear side. Here, a direction parallel to any one side of the rectangular-shaped piezoelectric vibration unit 50 is defined as an X-axis direction, and a direction parallel to another side, which is perpendicular to the one side, is defined as a Y-axis direction. The cantilever portion 55 may extend in a direction parallel to any one side of the rectangle. Accordingly, the degree to which the output amplification is concentrated in a predetermined specific sub-range in the low frequency range may be further increased, and it may become easy for a designer to accurately predetermine the aforementioned specific sub-range in which the amplification is greatly achieved. Further, it may also be possible to set the predetermined specific sub-range in the low frequency range to be narrower. In the case in which the cantilever portion 55 extends in the Y-axis direction, the sub-range in which the amplification is achieved is determined by the overhanging length D of the cantilever portion 55, and the magnitude of the entire output is determined by the X-axis-directional length X of the piezoelectric vibration unit 50.

In the case in which the piezoelectric vibration unit 50 is formed in a plate type having a rectangular shape, not a square shape, the cantilever portion 55 may extend in the direction (the Y-axis direction) parallel to the long side of the rectangle. Therefore, it is possible for a designer to predetermine the overhanging length D of the cantilever portion 55 within a wider range and to further amplify an increase in the output in the low frequency range.

The piezoelectric vibration unit 50 is attached to the rear surface of the supporter 80. The vibration generated by the piezoelectric vibration unit 50 is transferred to the display panel 100 via the supporter 80, and the front surface of the display panel 100 vibrates. As a result of such direct vibration of the display panel 100, a sound can be output. At the same time, the cantilever portion 55 may perform vibration having a predetermined amplitude in the front-rear direction or may generate a sound by directly vibrating air.

The gravity load of the piezoelectric vibration unit 50 is fully transferred to the rear surface of the display panel 100. The gravity load of the piezoelectric vibration unit 50 is transferred to the display panel 100 via the supporter 80. Therefore, the vibration generated by the piezoelectric vibration unit 50 is transferred to the display panel 100 without interference from components other than the supporter 80, thereby obtaining desired predetermined effects.

The piezoelectric vibration unit 50 may be formed so as to achieve the piezoelectric effect using a ceramic material.

The piezoelectric vibration unit 50 may use other well-known materials capable of achieving the piezoelectric effect. Preferably, the piezoelectric vibration unit 50 may include a PZT material so as to further amplify an increase in the magnitude of the vibration output in the low frequency range using the cantilever portion 55.

The rear surface of the supporter 80 and the front surface of the fixing portion 51 are attached to each other. The fixing portion 51 is an element, the front surface of which is in contact with the supporter 80. The length of the fixing portion 51, which is measured in the direction in which the cantilever portion 55 extends from the fixing portion 51, is defined as a fixing length L. The fixing length L, which is measured in the Y-axis direction in which the cantilever portion 55 extends from the fixing portion 51, is the Y-axis directional length of the fixing portion 51.

The cantilever portion 55 has a free end. The cantilever portion 55 is spaced apart from the rear surface of the display panel 100. The cantilever portion 55 is an element, the front surface of which is spaced apart from the display panel 100. The cantilever portion 55 has a predetermined overhanging length D. The length of the cantilever portion 55, which is measured in the direction in which the cantilever portion 55 extends from the fixing portion 51, is defined as the overhanging length D.

The front surface of the supporter 80 is attached to the rear surface of the display panel 100. The supporter 80 is supported only by the display panel 100. The supporter 80 supports the piezoelectric vibration unit 50. The supporter 80 is formed in a rectangular shape when seen from rear side.

The supporter 80 may be formed in a plate type having a predetermined thickness Ts in the front-rear direction. The separation distance between the front surface of the cantilever portion 55 and the rear surface of the display panel 100 may be the thickness Ts. In order to efficiently transfer the vibration generated by the piezoelectric vibration unit 50 to the display panel 100, it is preferable for the thickness Ts of the supporter 80 to be as small as possible.

The thickness Ts of the supporter 80 may be predetermined using the following equation 3. When the piezoelectric vibration unit 50 vibrates at a predetermined lowest frequency, the cantilever portion 55 has the largest amplitude. The thickness Ts is predetermined so as to prevent the cantilever portion 55 from touching the rear surface of the display panel 100 even when the cantilever portion 55 vibrates with the largest amplitude.

$$Ts = Am \times Ve \times fe \times Se \quad [\text{Equation 3}]$$

Here, Am refers to the maximum amplitude (mm) of the cantilever portion 55 when the piezoelectric vibration unit 50 vibrates, Ve refers to a correction value that is set in consideration of tolerance of the voltage that is applied to the piezoelectric vibration unit 50, fe refers to a correction value that is set in consideration of the rate of change of the lowest frequency of the piezoelectric vibration unit 50, and Se refers to a correction value that is set in consideration of a safety factor. In an example, when Am is 0.35 mm, Ve is 1.15, fe is 1.2 and Se is 1.3, the thickness Ts may be predetermined to be about 0.63 mm based on the above equation 3.

In another example, the thickness Ts of the supporter 80 may be predetermined to be 1.5 to 2 times as large as the maximum amplitude Am of the cantilever portion 55. The thickness Ts of the supporter 80 may be predetermined to be 1.7 to 1.9 times as large as the maximum amplitude Am of the cantilever portion 55.

The supporter 80 may be formed to have a quadrangular shape, a circular shape, an elliptical shape, etc. when seen from rear side. The supporter 80 may be formed in a plate type, which has a substantially constant thickness Ts in the front-rear direction. The supporter 80 may be made of a plastic material.

As can be seen from the experimental examples illustrated in FIGS. 9, 10, 11a to 11e and 12, the average magnitude of the vibration output in the low frequency range in type A1 and type A2 becomes greater than in type O1 and type O2, and the average magnitude of the vibration output in the high frequency range in type A1 and type A2 also becomes greater than in type O1 and type O2. Here, the low frequency range used for the experiments may be defined as being in the range from 100 Hz to 800 Hz. The frequency range from 100 Hz to 800 Hz is meaningful since it is a frequency range in which a sound image SI is perceived while it is a frequency range in which the vibration output is relatively low in comparison with other frequencies below 16,000 Hz in type O1 and type O2. Since the wavelength is lengthened in the range of frequencies that are lower than 100 Hz (the frequency range from greater than 0 Hz to less than 100 Hz), it is difficult for the user to perceive the generation position of the sound output (the sound image SI). Therefore, it is important to locate a sound source (the generation position of the sound) in a low frequency range of greater than or equal to 100 Hz at the front surface of the display panel 100, whereas it is less important to locate a sound source in the frequency range of less than 100 Hz at the front surface of the display panel 100. Further, since the frequency of the human voice is generally greater than or equal to 100 Hz, it is further important to increase the vibration output in the low frequency range of greater than or equal to 100 Hz in order to prevent a perceived disconnect between the image and the sound. In addition, a sub-speaker 40 (e.g. a woofer) may be provided to output sound having frequencies of less than or equal to 100 Hz.

Further, the high frequency range used for the experiments may be defined as being a range from 2,000 Hz to 16,000 Hz.

FIGS. 11a to 11e illustrate the experimental results in accordance with the overhanging length D of the cantilever portion 55 of the piezoelectric vibration unit 50 of type A1. The experimental group illustrated in FIG. 11a includes a cantilever portion 55 having an overhanging length D of 35 mm and a fixing portion 51 having a fixing length L of 5 mm. The experimental group illustrated in FIG. 11b includes a cantilever portion 55 having an overhanging length D of 30 mm and a fixing portion 51 having a fixing length L of 10 mm. The experimental group illustrated in FIG. 11c includes a cantilever portion 55 having an overhanging length D of 27.5 mm and a fixing portion 51 having a fixing length L of 12.5 mm. The experimental group illustrated in FIG. 11d includes a cantilever portion 55 having an overhanging length D of 25 mm and a fixing portion 51 having a fixing length L of 15 mm. The experimental group illustrated in FIG. 11e includes a cantilever portion 55 having an overhanging length D of 20 mm and a fixing portion 51 having a fixing length L of 20 mm.

Figure 12:
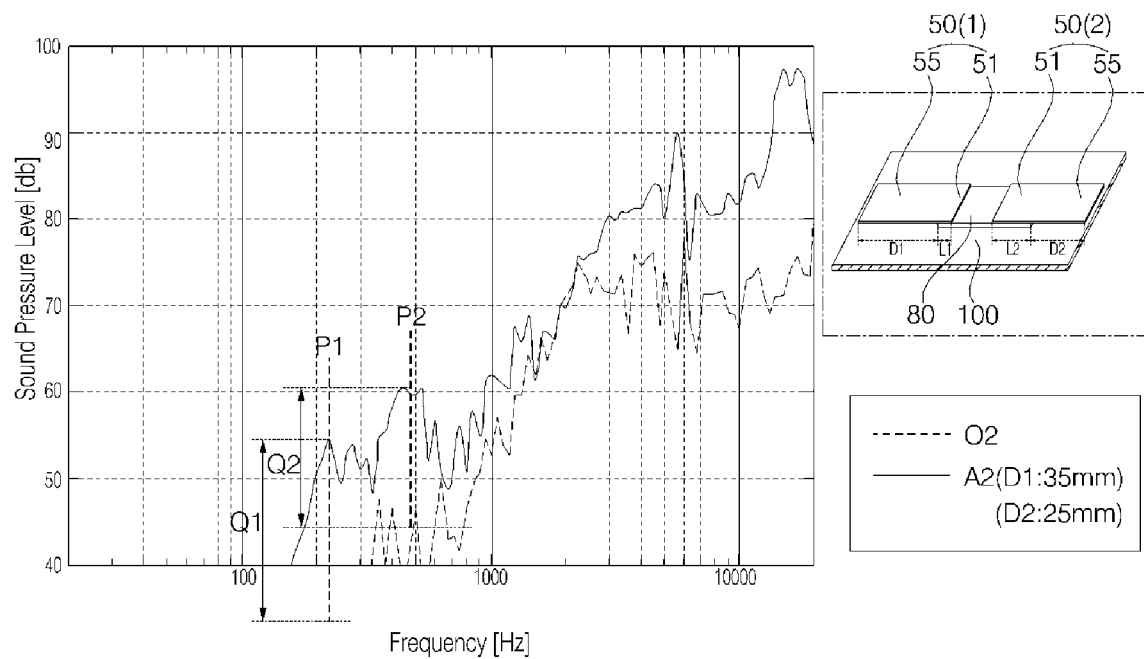

FIG. 12 illustrates the experimental result of the case in which the first piezoelectric vibration unit 50(1) and the second piezoelectric vibration unit 50(2) of type A2 perform output operation at the same time. The experimental group illustrated in FIG. 12 includes a first piezoelectric vibration unit 50(1) including a cantilever portion 55 having a first overhanging length D1 of 35 mm and a fixing portion 51 having a first fixing length L1 of 5 mm and a second piezoelectric vibration unit 50(2) including a cantilever portion 55 having a second overhanging length D2 of 25 mm and a fixing portion 51 having a second fixing length L2 of 15 mm.

As can be seen from the experimental results illustrated in FIGS. 11a to 11e and 12, there is an advantageous effect in that the vibration output in the low frequency range of the piezoelectric vibration unit 50 increases. Further, there is an advantageous effect in that the average vibration output in the high frequency range of the piezoelectric vibration unit 50 also increases.

As can be seen from the experimental results illustrated in FIGS. 11a to 11e, as the overhanging length D increases, the intermediate value (or the average value) of the sub-range, in which the magnitude of the output is most greatly increased in the low frequency range, decreases gradually. As the overhanging length D increases, the average increase in the magnitude of the output in the sub-range becomes larger. Here, "sub-range" refers to a certain frequency range that is narrower than the aforementioned low frequency range and is within the low frequency range. The average magnitude of the output that is increased in the sub-range becomes larger than the average magnitude of the output that is increased in other ranges below or above the sub-range. The sub-range is determined by the natural frequency of the cantilever portion 55 having a specific overhanging length D. FIGS. 11a to 11e illustrate an intermediate value P (hereinafter, referred to as a "maximum-increase frequency P") of the sub-range in which the magnitude of the output is most greatly increased in the low frequency range as compared to the comparative example O2 and an average magnitude Q (hereinafter, referred to as an "increase level Q") of the output that is increased in the sub-range as compared to the comparative example O2. According to the experimental result illustrated in FIG. 11a, the maximum-increase frequency P is about 200 Hz and the increase level Q is about 25 dB. According to the experimental result illustrated in FIG. 11b, the maximum-increase frequency P is about 300 Hz and the increase level Q is about 20 dB. According to the experimental result illustrated in FIG. 11c, the maximum-increase frequency P is about 375 Hz and the increase level Q is about 15 dB. According to the experimental result illustrated in FIG. 11d, the maximum-increase frequency P is about 450 Hz and the increase level Q is about 15 dB. According to the experimental result illustrated in FIG. 11e, the maximum-increase frequency P is about 700 Hz and the increase level Q is about 25 dB.

Figure 11A:
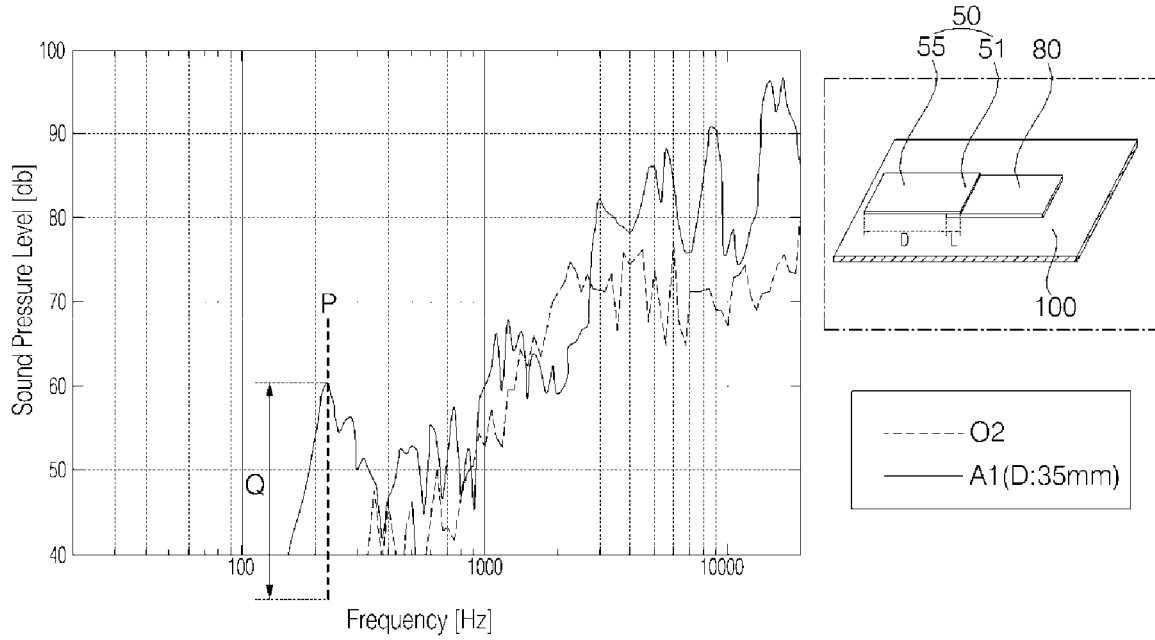
Figure 11B:
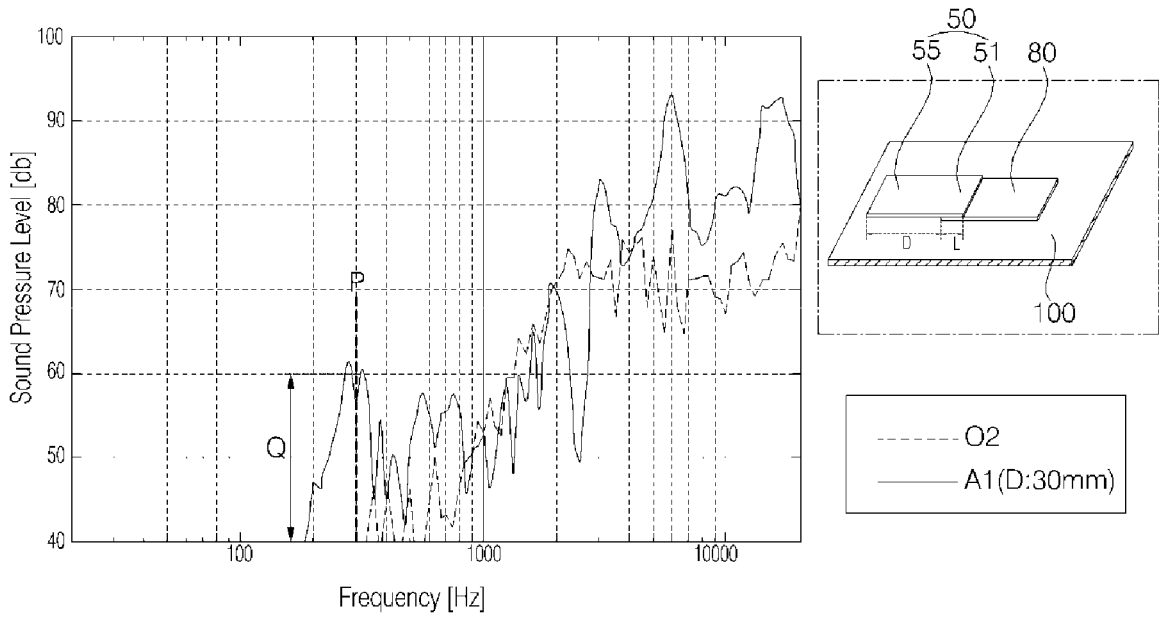
Figure 11C:
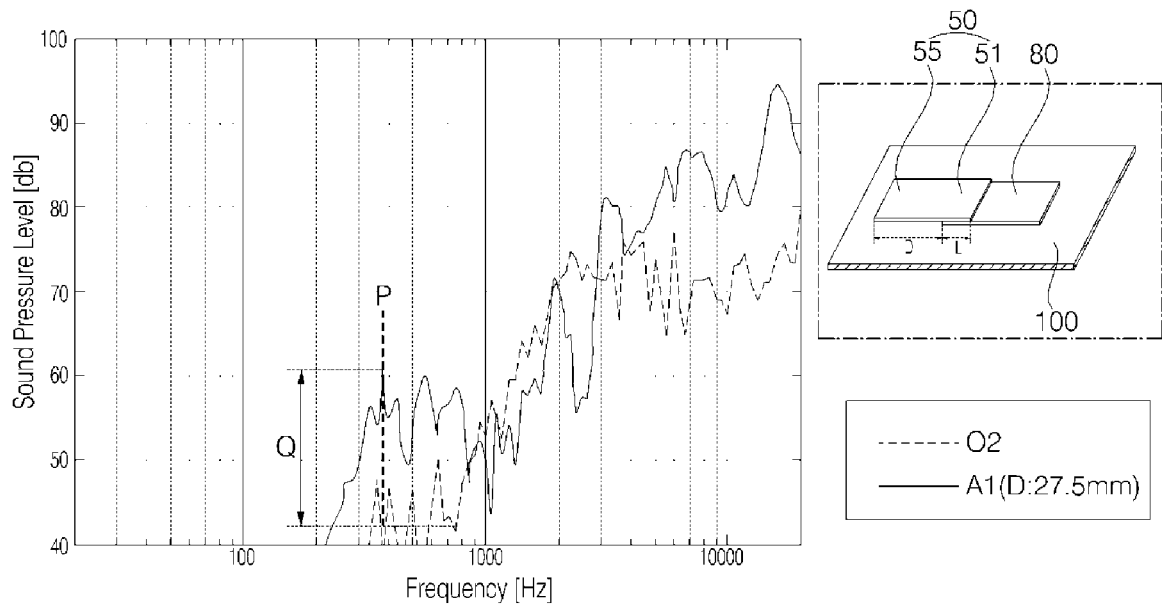
Figure 11D:
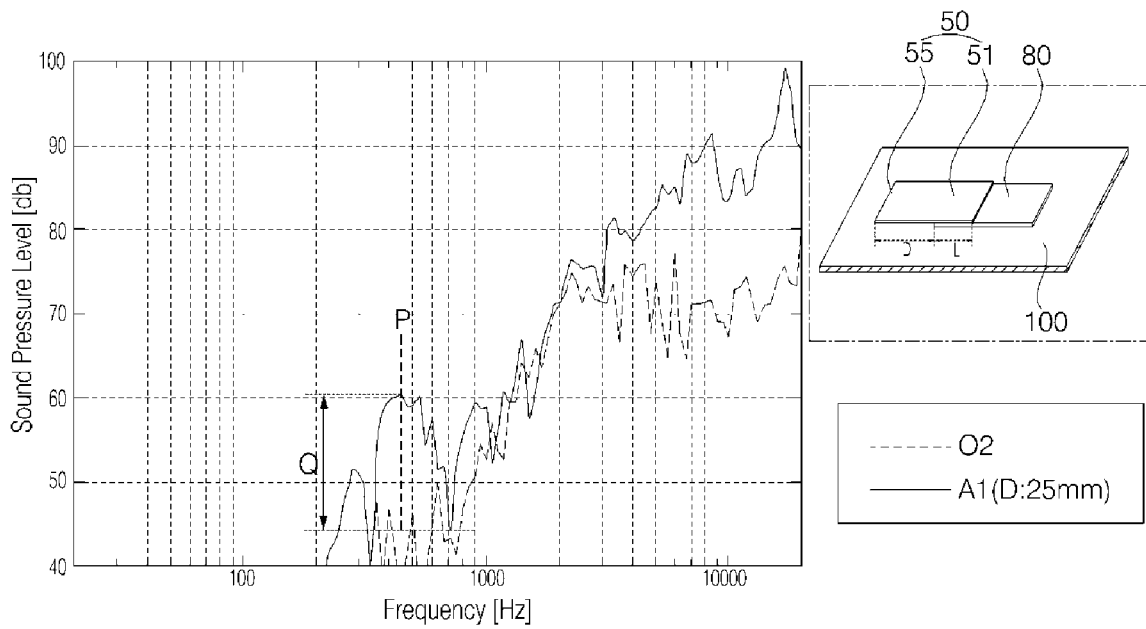
Figure 11E:
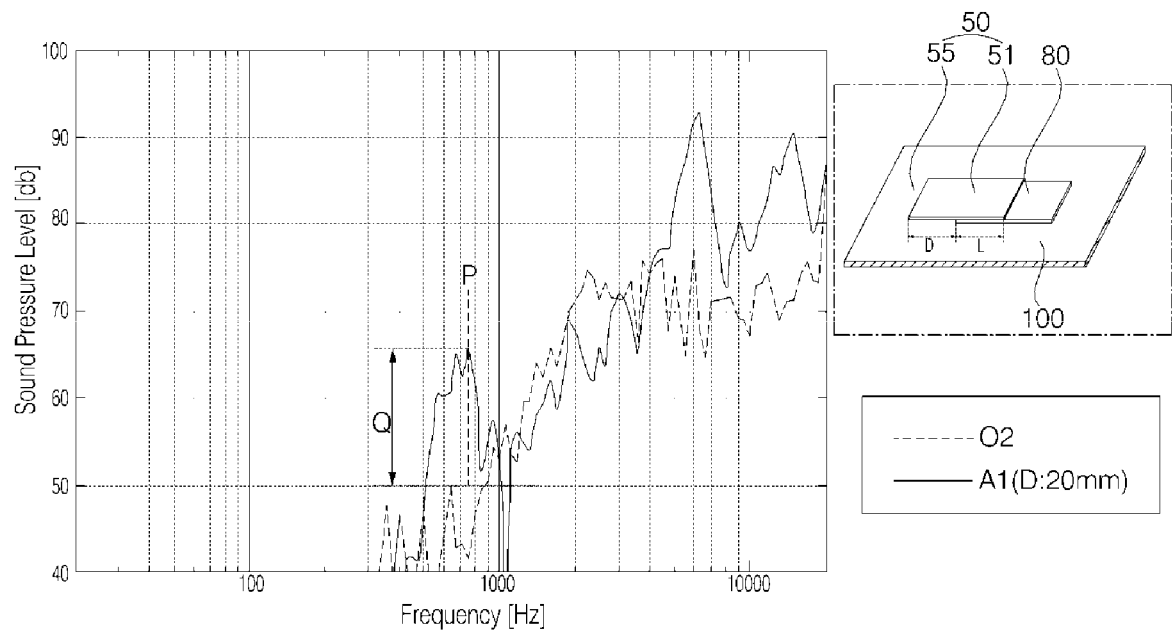

In the experimental group illustrated in FIG. 11e, the overhanging length D and the fixing length L are equal to each other. If the fixing length L is set to be larger than the overhanging length D, the maximum-increase frequency P increases above 700 Hz. Since it is advantageous for the maximum-increase frequency P to fall within the low frequency range, it is preferable for the overhanging length D to be greater than or equal to the fixing length L. Further, the overhanging length D may be set to 20 mm or more. The overhanging length D may be 20 mm or more, so long as the fixing length L is not 0. The overhanging length D may be from 20 mm to 35 mm.

Further, it is preferable for the overhanging length D to be at least four times as large as the fixing length L (refer to FIGS. 11a and 11b). Further, the overhanging length D may be 30 mm or more. The overhanging length D may be 30 mm or more, so long as the fixing length L is not 0. The overhanging length D may be from 30 mm to 35 mm. Owing to the above-described constructions, there is an effect in that the maximum-increase frequency P is predetermined to be from about 150 to 350 Hz. In the comparative examples O1 and O2, the magnitude of the output in the frequency range below about 350 Hz is extremely low. However, according to the experimental groups of the invention, it is possible to greatly increase the magnitude of the output in the sub-range within the frequency range in which the magnitude of the output is extremely low. Further, since output such as the human voice, in which the position of the sound image is important, falls within the range from about 150 to 300 Hz, the above effect has a technically significant meaning. Further, as a result of the overhanging length D being set to be at least four times as large as the fixing length L, the increase level Q may become larger.

In order to accurately adapt the experimental results in FIGS. 11a to 11e, in which the maximum-increase frequency P falls within the low frequency range, to actual products, it is preferable for the thickness of the piezoelectric vibration unit 50 in the front-rear direction to be from 0.6 mm to 1 mm and for the sum of the overhanging length D and the fixing length L to be from 35 mm to 45 mm. Further, it is preferable for the piezoelectric vibration unit 50 to include a PZT material.

A first maximum-increase frequency P1 corresponding to the first overhanging length D1 and a second maximum-increase frequency P2 corresponding to the second overhanging length D2, which is different from the first overhanging length D1, can be seen from the experimental result in FIG. 12. The first maximum-increase frequency P1 and the second maximum-increase frequency P2 are the intermediate values (or the average values) of the two respective sub-ranges, which are spaced apart from each other in the low frequency range. According to the experimental result in FIG. 12, the first maximum-increase frequency P1 is about 220 Hz, the first increase level Q1 is about 20 dB, and the sub-range within which the first maximum-increase frequency P1 falls is a range that is primarily influenced by the first piezoelectric vibration unit 50(1). Further, according to the experimental result in FIG. 12, the second maximum-increase frequency P2 is about 450 Hz, the second increase level Q2 is about 15 dB, and the sub-range within which the second maximum-increase frequency P2 falls is a range that is primarily influenced by the second piezoelectric vibration unit 50(2). Owing to the plurality of cantilever portions having overhanging lengths that are different from each other, it is possible to predetermine a plurality of sub-ranges, in which the magnitudes of output are greatly increased, in the low frequency range.

Hereinafter, an embodiment (FIG. 13a) in which a single piezoelectric vibration unit 50 includes one cantilever portion 55, an embodiment (FIG. 13b) in which a single piezoelectric vibration unit 50 includes two cantilever portions 55-1 and 55-2, an embodiment (FIG. 13c) in which a single piezoelectric vibration unit 50 includes three cantilever portions 55-1, 55-2 and 55-3, and an embodiment (FIG. 13d) in which a single piezoelectric vibration unit 50 includes four cantilever portions 55-1, 55-2, 55-3 and 55-4 will be described with reference to FIGS. 13a to 13d. The piezoelectric vibration unit 50 refers to a unitary element that exhibits a piezoelectric effect when voltage is applied thereto. In these embodiments, the piezoelectric vibration unit 50 is formed by stacking a plurality of layers of a PZT material and is formed in a rectangular shape including two sides, each extending in the X-axis direction by a predetermined length X, and two sides, each extending in the Y-axis direction by a predetermined length Y, when seen from rear side.

Figure 13A:
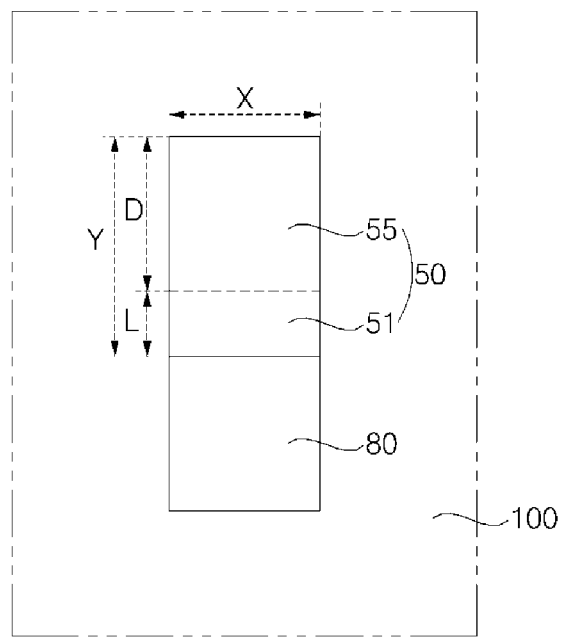
FIGS. 13a to 13d are rear elevation views of modifications of the piezoelectric vibration unit 50, in which the number of cantilever portions 55 is varied.

FIG. 13a illustrates an embodiment of type A1, in which the cantilever portion 55 extends from the fixing portion 51 in either the positive or negative Y-axis direction. The cantilever portion 55 has a predetermined overhanging length D, and the fixing portion 51 has a predetermined fixing length L. The sum of the overhanging length D and the fixing length L becomes the Y-axis-directional length Y.

Figure 13B:
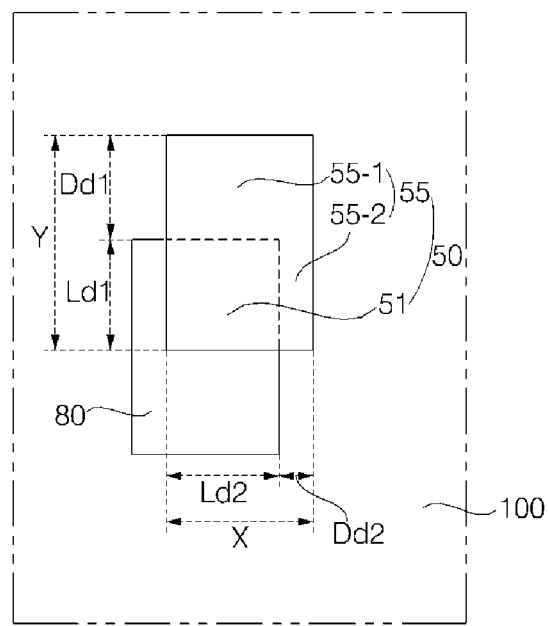
Figure 13C:
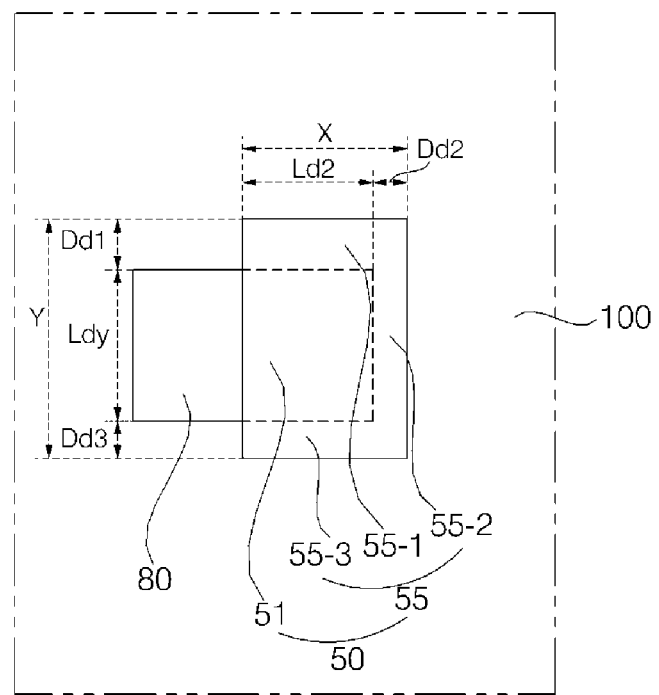
Figure 13D:
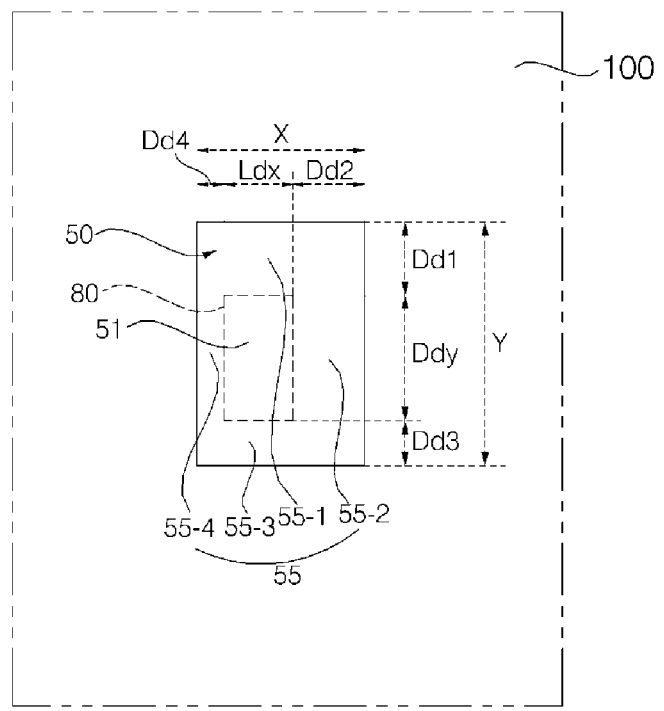

FIGS. 13b to 13d illustrate embodiments in which a single piezoelectric vibration unit 50 includes a plurality of cantilever portions 55. The piezoelectric vibration unit 50 includes a first-directional cantilever portion 55-1, which extends from the fixing portion 51 in a first direction. The piezoelectric vibration unit 50 includes a second-directional cantilever portion (at least one of 55-2, 55-3 and 55-4), which extends from the fixing portion 51 in a direction perpendicular to the first direction or in a direction opposite the first direction. This construction has an effect in which the magnitudes of output are increased at the same time in a plurality of predetermined sub-ranges in the low frequency range by applying voltage to a single piezoelectric vibration unit 50.

In the embodiment illustrated in FIG. 13b, the piezoelectric vibration unit 50 includes a first-directional cantilever portion 55-1, which extends from the fixing portion 51 in a first direction, and a second-directional cantilever portion 55-2, which extends from the fixing portion 51 in a direction perpendicular to the first direction. The first-directional cantilever portion 55-1 has a first-directional overhanging length Dd1, and the fixing portion 51 has a first-directional fixing length Ld1, which is measured in the direction in which the first-directional cantilever portion 55-1 extends from the fixing portion 51. That is, the sum of the first-directional overhanging length Dd1 and the first-directional fixing length Ld1 becomes the Y-axis-directional length Y. The second-directional cantilever portion 55-2 has a second-directional overhanging length Dd2, and the fixing portion 51 has a second-directional fixing length Ld2, which is measured in the direction in which the second-directional cantilever portion 55-2 extends from the fixing portion 51. That is, the sum of the second-directional overhanging length Dd2 and the second-directional fixing length Ld2 becomes the X-axis-directional length X.

In the embodiment illustrated in FIG. 13c, the piezoelectric vibration unit 50 includes a first-directional cantilever portion 55-1 and a second-directional cantilever portion 55-2. The piezoelectric vibration unit 50 further includes a third-directional cantilever portion 55-3, which extends from the fixing portion 51 in a direction opposite the first direction. The first-directional cantilever portion 55-1 has a first-directional overhanging length Dd1, the third-directional cantilever portion 55-3 has a third-directional overhanging length Dd3, and the fixing portion 51 has a Y-axis-directional fixing length Ldy, which is measured in the direction in which the first-directional cantilever portion 55-1 extends from the fixing portion 51 or in which the third-directional cantilever portion 55-3 extends from the fixing portion 51. That is, the sum of the first-directional overhanging length Dd1, the third-directional overhanging length Dd3 and the Y-axis-directional fixing length Ldy becomes the Y-axis-directional length Y. The second-directional cantilever portion 55-2 has a second-directional overhanging length Dd2, and the fixing portion 51 has a second-directional fixing length Ld2, which is measured in the direction in which the second-directional cantilever portion 55-2 extends from the fixing portion 51. That is, the sum of the second-directional overhanging length Dd2 and the second-directional fixing length Ld2 becomes the X-axis-directional length X.

In the embodiment illustrated in FIG. 13d, the piezoelectric vibration unit 50 includes a first-directional cantilever portion 55-1, a second-directional cantilever portion 55-2 and a third-directional cantilever portion 55-3. The piezoelectric vibration unit 50 further includes a fourth-directional cantilever portion 55-4, which extends from the fixing portion 51 in a direction opposite the second direction. The first-directional cantilever portion 55-1 has a first-directional overhanging length Dd1, the third-directional cantilever portion 55-3 has a third-directional overhanging length Dd3, and the fixing portion 51 has a Y-axis-directional fixing length Ldy, which is measured in the direction in which the first-directional cantilever portion 55-1 extends from the fixing portion 51 or in which the third-directional cantilever portion 55-3 extends from the fixing portion 51. The second-directional cantilever portion 55-2 has a second-directional overhanging length Dd2, the fourth-directional cantilever portion 55-4 has a fourth-directional overhanging length Dd4, and the fixing portion 51 has an X-axis-directional fixing length Ldx, which is measured in the direction in which the second-directional cantilever portion 55-2 extends from the fixing portion 51 or in which the fourth-directional cantilever portion 55-4 extends from the fixing portion 51.

The first to fourth directions may be directions that are perpendicular to the front-rear direction.

Hereinafter, embodiments, each including a plurality of piezoelectric vibration units 50, will be described with reference to FIGS. 14a to 19b. Each embodiment may be constructed such that voltage is selectively applied to the plurality of piezoelectric vibration units 50.

The piezoelectric vibration units 50 may be formed by stacking multiple layers. The number of layers and the material of layers of each of the piezoelectric vibration units 50 may be the same as those of each of the others. The piezoelectric vibration units 50 may have the same thickness as each other in the front-rear direction. The piezoelectric vibration units 50 may have the same length as each other, measured in a direction perpendicular to the overhanging length D.

Figure 14A:
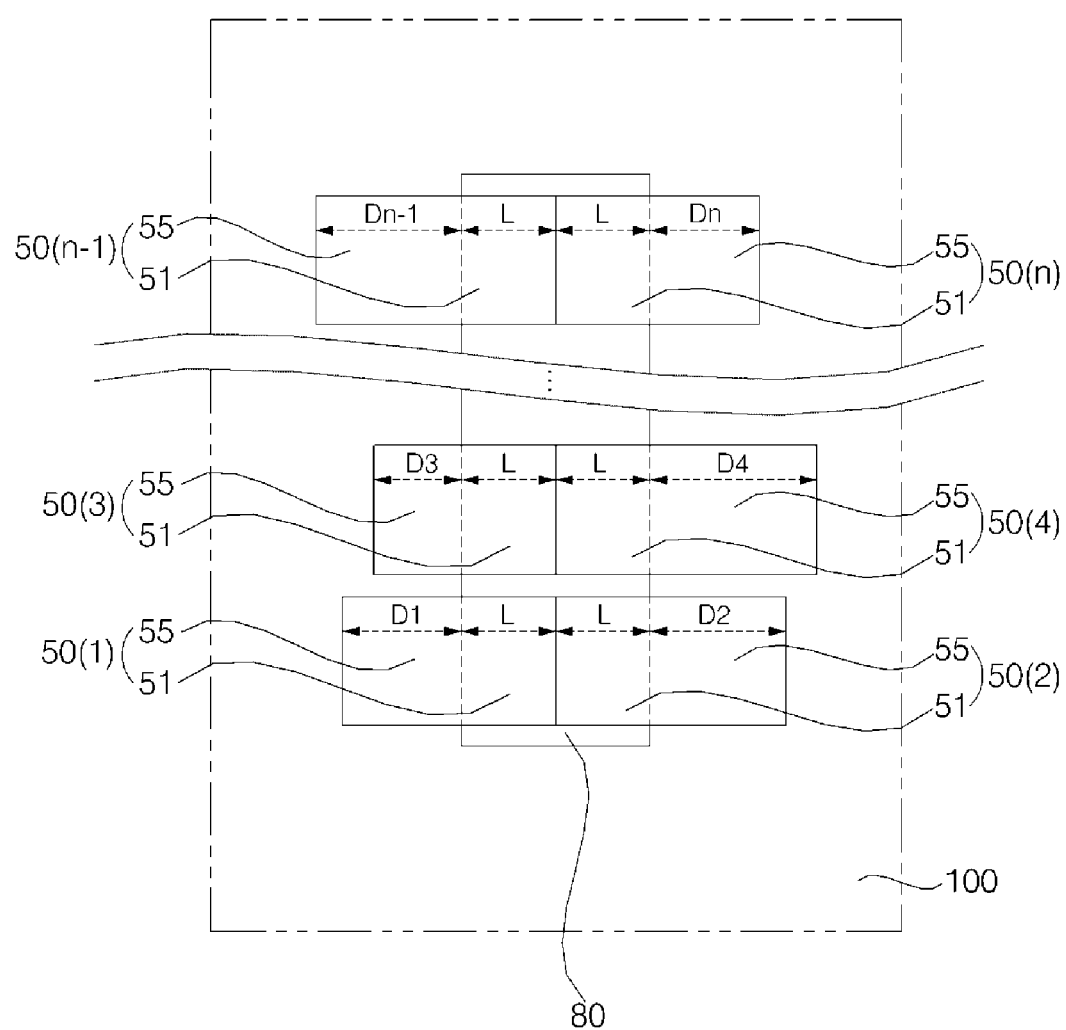
FIGS. 14a and 14b are rear elevation views of one embodiment and another embodiment of a plurality (the number is n) of piezoelectric vibration units 50(1), 50(2), 50(3), 50(4), ..., 50(n−1) and 50(n) attached to a single supporter 80.

As shown in FIG. 14a, the sum of the overhanging length D and the fixing length L may differ for each of the piezoelectric vibration units 50. The piezoelectric vibration units 50 may have the same fixing length L as each other and may have overhanging lengths D1, D2, . . . and Dn different from each other. Also in this case, the piezoelectric vibration units 50 may be the same as each other with respect to the X-axis-directional length, the number of layers, the material and the thickness in the front-rear direction thereof.

Figure 14B:
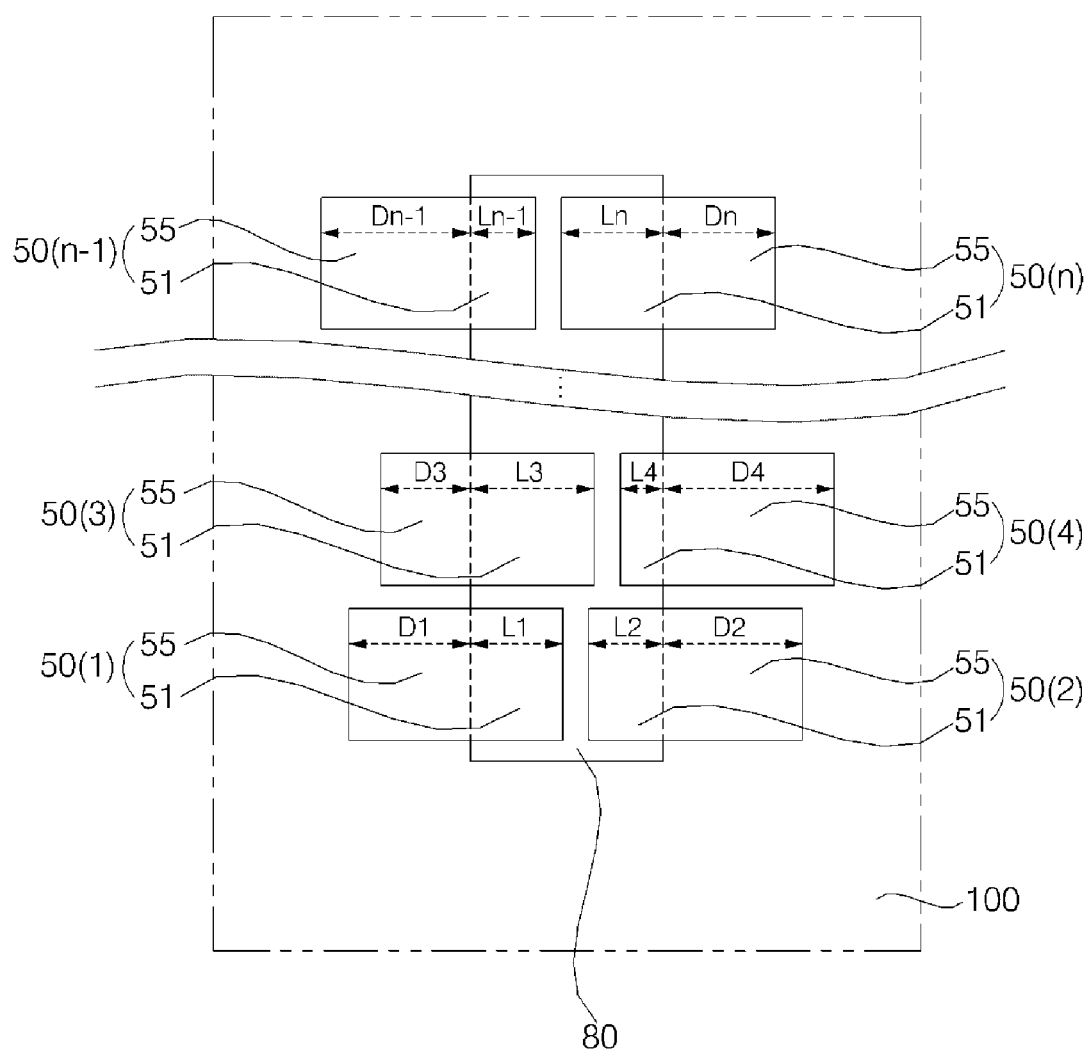

As shown in FIG. 14b, the piezoelectric vibration units 50 may be formed to have the same dimensions as each other. The piezoelectric vibration units 50 may be formed in the same rectangular shape when seen from rear side. The sum of the overhanging length D and the fixing length L of each of the piezoelectric vibration units 50 may be equal to that of each of the others. A length of the first piezoelectric vibration unit 50(1) and a length of the second piezoelectric vibration unit 50(2) are the same. The piezoelectric vibration units 50 may have the same Y-axis-directional length as each other. The piezoelectric vibration units 50 may have the same X-axis-directional length as each other.

At least two of the overhanging lengths of the cantilever portions of the piezoelectric vibration units may be set to be different from each other. As a result, it is possible to predetermine at least two sub-ranges, in which the magnitudes of output are greatly increased, in the low frequency range.

The embodiment of type A2, which includes two piezoelectric vibration units 50(1) and 50(2), will now be described. The piezoelectric vibration units 50 include a first piezoelectric vibration unit 50(1), which includes a first cantilever portion 55 that has a first overhanging length D1. The first piezoelectric vibration unit 50(1) includes a first fixing portion 51 having a first fixing length L1. The piezoelectric vibration units 50 include a second piezoelectric vibration unit 50(2), which includes a second cantilever portion 55 that has a second overhanging length D2, which is different from the first overhanging length D1. The second piezoelectric vibration unit 50(2) includes a second fixing portion 51 having a second fixing length L2. The direction in which the cantilever portion 55 of the first piezoelectric vibration unit 50(1) extends may be set to be opposite the direction in which the cantilever portion 55 of the second piezoelectric vibration unit 50(2) extends. The cantilever portion 55 of the first piezoelectric vibration unit 50(1) may overhang from a first side of the supporter 80, and the cantilever portion 55 of the second piezoelectric vibration unit 50(2) may overhang from a second side of the supporter 80 opposite the first side. One of the first overhanging length D1 and the second overhanging length D2 may be set to be greater than the other. One of the first fixing length L1 and the second fixing length L2 may be set to be greater than the other. The first overhanging length D1 may be set to be greater than the second overhanging length D2, and the first fixing length L1 may be set to be shorter than the second fixing length L2.

As shown in FIGS. 14a and 14b, the display apparatus 1 may include first to $n^{th}$ piezoelectric vibration units 50(1), 50(2), ... and 50(n), which are attached to the supporter 80. The first to $n^{th}$ piezoelectric vibration units 50(1), 50(2), ... and 50(n) are attached to a single supporter 80. Each of the first to $n^{th}$ piezoelectric vibration units 50(1), 50(2), ... and 50(n) includes a fixing portion 51, which is attached to the supporter 80, and a cantilever portion 55, which overhangs from the supporter 80. At least two of the overhanging lengths D1, D2, ... and Dn of the cantilever portions 55 of the first to $n^{th}$ piezoelectric vibration units 50(1), 50(2), ... and 50(n) are different from each other. The overhanging lengths D1, D2, ... and Dn of the respective cantilever portions 55 of the first to $n^{th}$ piezoelectric vibration units 50(1), 50(2), ... and 50(n) may be different from each other. Here, n is a natural number of 2 or more. The $n^{th}$ piezoelectric vibration unit 50(n) includes an $n^{th}$ fixing portion 51, which is attached to the supporter 80, and an $n^{th}$ cantilever portion 55, which extends from the $n^{th}$ fixing portion in a predetermined direction. The $n^{th}$ cantilever portion 55 has an $n^{th}$ overhanging length Dn. The n-$1^{th}$ piezoelectric vibration unit 50(n-1) includes an n-$1^{th}$ fixing portion 51, which is attached to the supporter 80, and an n-$1^{th}$ cantilever portion 55, which extends from the n-$1^{th}$ fixing portion in a predetermined direction. The n-$1^{th}$ cantilever portion 55 has an n-$1^{th}$ overhanging length Dn-1. The first to $n^{th}$ piezoelectric vibration units 50(1), 50(2), ... and 50(n) are provided in this manner. The supporter 80 may be formed to extend lengthwise in a predetermined direction when seen from rear side. The piezoelectric vibration units 50(1), 50(2), ... and 50(n) may be arranged such that the cantilever portions 55 thereof overhang from the supporter 80 in a direction perpendicular to the longitudinal direction of the supporter 80. The piezoelectric vibration units 50(1), 50(2), ... and 50(n) may be arranged such that the lateral ends of the adjacent piezoelectric vibration units are in contact with each other, or may be arranged so as to be spaced apart from each other, as illustrated in FIGS. 14a and 14b. A side of the fixing portion of one piezoelectric vibration unit 50(1) may contact a corresponding side of the fixing portion of other piezoelectric vibration unit 50(2), as illustrated in FIG. 14a. A side of the fixing portion of one piezoelectric vibration unit 50(1) may be spaced apart and parallel to a corresponding side of the fixing portion of other piezoelectric vibration unit 50(2), as illustrated in FIG. 14b.

In the embodiment illustrated in FIG. 14a, the first to $n^{th}$ piezoelectric vibration units 50(1), 50(2), ... and 50(n) may have the same fixing length L of the fixing portion 51 as each other. The entire lengths of the cantilever portions 55 of the piezoelectric vibration units 50(1), 50(2), ... and 50(n) in the extending direction thereof may be different from each other so that the overhanging lengths D1, D2, ... and Dn of the piezoelectric vibration units 50(1), 50(2), ... and 50(n) are different from each other. The Y-axis-directional lengths (each being equal to the sum of the overhanging length and the fixing length) of the first to $n^{th}$ piezoelectric vibration units 50(1), 50(2), ... and 50(n) may be different from each other so that the overhanging lengths D1, D2, ... and Dn of the first to $n^{th}$ piezoelectric vibration units 50(1), 50(2), ... and 50(n), which have the same fixing length L as each other, are different from each other. As shown in FIG. 14a, the first to $n^{th}$ piezoelectric vibration units 50(1), 50(2), ... and 50(n) may be formed in rectangular shapes, which have dimensions different from each other, when seen from rear side. The overhanging lengths D of the cantilever portions 55 of the two piezoelectric vibration units 50, which include the fixing portions 51 having the same fixing length L as each other, may be different from each other. One end of the fixing portion 51 may be connected with the cantilever portion 55, and the opposite end of the fixing portion 51 may be located at the center portion of the rear surface of the supporter 80. The opposite end of the fixing portion 51 may be in contact with the proximal end of the fixing portion 51 of another piezoelectric vibration unit 50 that is located adjacent thereto. The proximal ends of the first to $n^{th}$ piezoelectric vibration units 50(1), 50(2), ... and 50(n) may be arranged along the center portion of the rear surface of the supporter 80. The vibration generated by the first to $n^{th}$ piezoelectric vibration units 50(1), 50(2), ... and 50(n) may be transferred to the supporter 80 via the constant contact areas between the first to $n^{th}$ piezoelectric vibration units 50(1), 50(2), ... and 50(n) and the supporter 80. Further, the process of attaching the first to $n^{th}$ piezoelectric vibration units 50(1), 50(2), ... and 50(n) to the supporter 80 is facilitated.

In the embodiment illustrated in FIG. 14b, the fixing lengths L1, L2, ... and Ln of the fixing portions 51 of the first to $n^{th}$ piezoelectric vibration units 50(1), 50(2), ... and 50(n) may be different from each other. The first to $n^{th}$ piezoelectric vibration units 50(1), 50(2), ... and 50(n) have the same dimensions as each other. The fixing lengths L1, L2, ... and Ln of the piezoelectric vibration units 50(1), 50(2), ... and 50(n) may be set to be different from each other so that the overhanging lengths D1, D2, ... and Dn of the piezoelectric vibration units 50(1), 50(2), ... and 50(n) are different from each other. As the overhanging length D of any one piezoelectric vibration unit 50 increases, the fixing length L may decrease. The first fixing portion 51 has a first fixing length L1, which is measured in the direction in which the cantilever portion 55 extends from the first fixing portion 51. The n-$1^{th}$ fixing portion 51 has an n-$1^{th}$ fixing length Ln-1, which is measured in the direction in which the cantilever portion 55 extends from the n−1$^{th}$ fixing portion 51. The n$^{th}$ fixing portion 51 has an n$^{th}$ fixing length Ln, which is measured in the direction in which the cantilever portion 55 extends from the n$^{th}$ fixing portion 51 (where n is a natural number of 2 or more). As a result of the first to n$^{th}$ piezoelectric vibration units 50(1), 50(2), . . . and 50(n) being formed to have the same dimensions, it is possible to simplify the process of manufacturing the piezoelectric vibration units while predetermining the respective maximum-increase frequencies P of the first to n$^{th}$ piezoelectric vibration units 50(1), 50(2), . . . and 50(n).

Hereinafter, the present invention will be described with reference to the embodiment illustrated in FIG. 14b rather than the embodiment illustrated in FIG. 14a; however, the present disclosure is not limited thereto.

Referring to FIGS. 14a to 18, the display apparatus 1 includes the first to n$^{th}$ piezoelectric vibration units 50(1), 50(2), . . . and 50(n), in which n may be a natural number of 3 or more. The direction in which the cantilever portion 55 of the first piezoelectric vibration unit 50(1) overhangs may be opposite the direction in which the cantilever portion 55 of the second piezoelectric vibration unit 50(2) overhangs. The supporter 80 is formed to extend lengthwise in a direction perpendicular to the direction in which the second piezoelectric vibration unit 50(2) overhangs from the supporter 80, thereby providing an area to which the third piezoelectric vibration unit 50(3) is attached. In an embodiment in which n is 4 or more, the supporter 80 extends lengthwise in a direction perpendicular to the direction in which the second piezoelectric vibration unit 50(2) overhangs from the supporter 80, thereby providing an area to which the third to n$^{th}$ piezoelectric vibration units 50(3), 50(4), . . . and 50(n) are attached. When seen from rear side, the supporter 80 may be formed in a rectangular shape having a pair of long sides, which extend in a direction perpendicular to the direction in which the piezoelectric vibration units overhang from the supporter 80, and a pair of short sides, which are perpendicular to the long sides. The cantilever portions 55 of the piezoelectric vibration units 50 may be arranged along at least one of the pair of long sides of the supporter 80.

Figure 15:
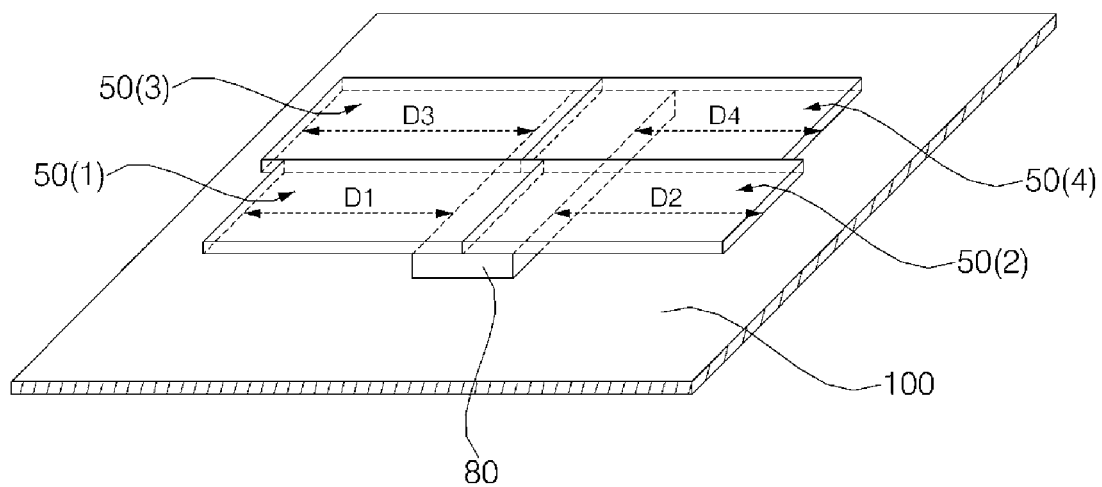
FIGS. 15 to 18 are perspective views illustrating embodiments of a plurality of piezoelectric vibration units 50 attached to a single supporter 80.

An embodiment illustrated in FIG. 15 includes the first to fourth piezoelectric vibration units 50(1), 50(2), 50(3) and 50(4). The first piezoelectric vibration unit 50(1) includes a first cantilever portion 55, which extends from the fixing portion 51 by a first overhanging length D1 in one direction. The second piezoelectric vibration unit 50(2) includes a second cantilever portion 55, which extends from the fixing portion 51 by a second overhanging length D2 in a direction opposite the one direction. The third piezoelectric vibration unit 50(3) includes a third cantilever portion 55, which extends from the fixing portion 51 by a third overhanging length D3 in the one direction. The fourth piezoelectric vibration unit 50(4) includes a fourth cantilever portion 55, which extends from the fixing portion 51 by a fourth overhanging length D4 in a direction opposite the one direction. The first to fourth overhanging lengths D1, D2, D3 and D4 may be different from each other. The first piezoelectric vibration unit 50(1) and the third piezoelectric vibration unit 50(3) are arranged so as to be in contact with each other in a direction perpendicular to the direction in which the cantilever portions 55 thereof extend from the fixing portions 51 thereof. The second piezoelectric vibration unit 50(2) and the fourth piezoelectric vibration unit 50(4) are arranged so as to be in contact with each other in a direction perpendicular to the direction in which the cantilever portions 55 thereof extend from the fixing portions 51 thereof.

Figure 16:
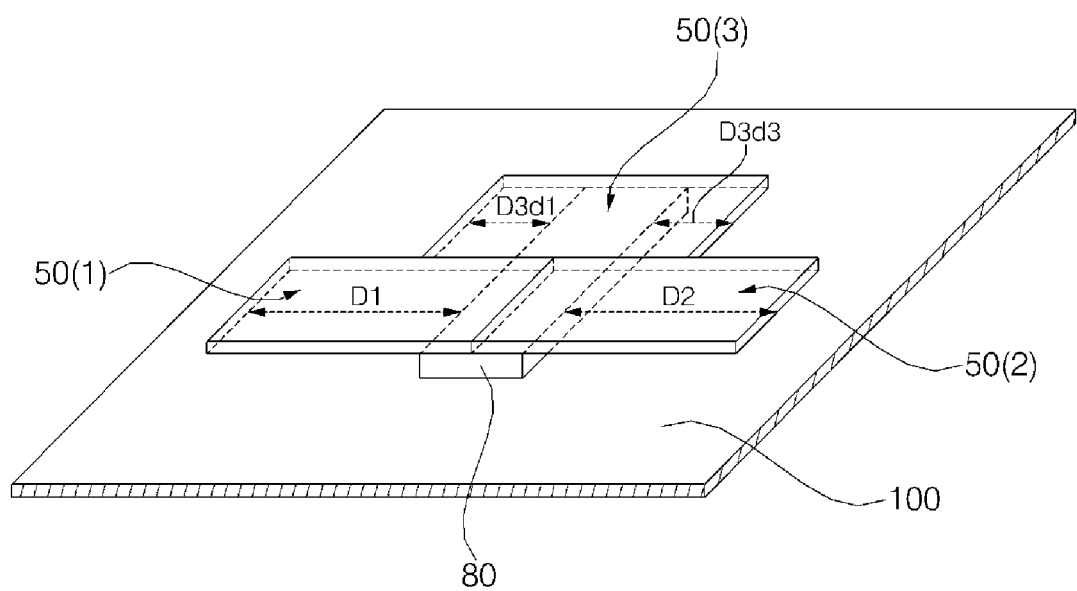
Figure 17:
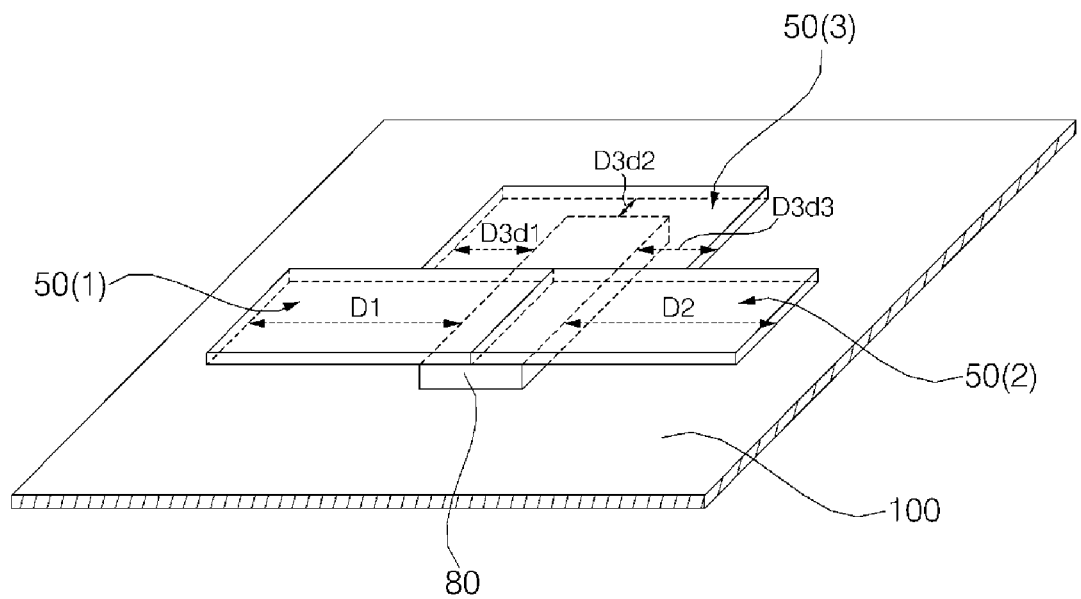

Each of embodiments illustrated in FIGS. 16 and 17 includes a plurality of piezoelectric vibration units 50, at least one of which may include a plurality of cantilever portions 55. The plurality of piezoelectric vibration units 50 may include a first piezoelectric vibration unit 50(1) comprising a first cantilever portion 55 and a first fixing portion 51, a second piezoelectric vibration unit 50(2) comprising a second cantilever portion 55 and a second fixing portion 51, and a third piezoelectric vibration unit 50(3) comprising a third cantilever portion 55 and a third fixing portion 51. The first cantilever portion 55 may overhang from a first side of the supporter 80, and the second cantilever portion 55 may overhang from a second side of the supporter 80 opposite the first side. the third cantilever portion 55 may comprise a one-directional cantilever portion which overhangs from the first side of the supporter 80 and a other-directional portion which overhangs from the second side of the supporter 80.

An embodiment illustrated in FIG. 16 includes the first to third piezoelectric vibration units 50(1), 50(2) and 50(3). The third piezoelectric vibration unit 50(3) includes a first-directional cantilever portion 55-1, which extends from the fixing portion 51 by an overhanging length D3d1 in a first direction, and a third-directional cantilever portion 55-3, which extends from the fixing portion 51 by an overhanging length D3d3 in a third direction, which is opposite the first direction. The first piezoelectric vibration unit 50(1) includes a cantilever portion 55, which extends from the fixing portion 51 in the first direction. The second piezoelectric vibration unit 50(2) includes a cantilever portion 55, which extends from the fixing portion 51 in the third direction.

An embodiment illustrated in FIG. 17 will now be described on the basis of differences with the embodiment illustrated in FIG. 16. The third piezoelectric vibration unit 50(3) includes a first-directional cantilever portion 55-1, which extends from the fixing portion 51 by an overhanging length D3d1 in a first direction, a second-directional cantilever portion 55-2, which extends from the fixing portion 51 by an overhanging length D3d2 in a second direction, which is perpendicular to the first direction, and a third-directional cantilever portion 55-3, which extends from the fixing portion 51 by an overhanging length D3d3 in a third direction, which is opposite the first direction. The third cantilever portion 50(3) may overhang from at least a third side of the supporter 80.

Figure 18:
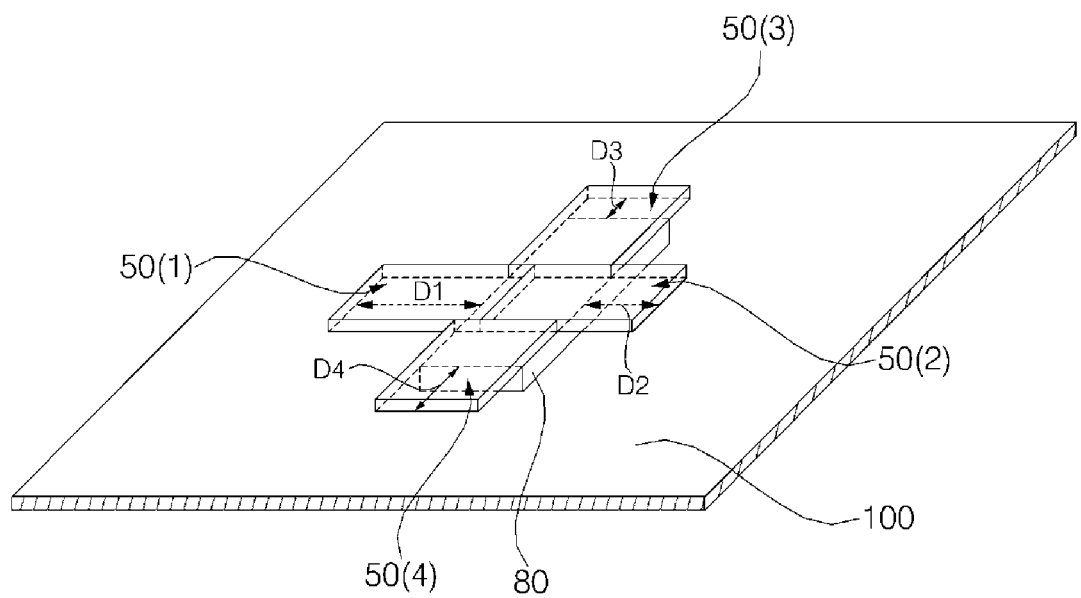

An embodiment illustrated in FIG. 18 includes the first to fourth piezoelectric vibration units 50(1), 50(2), 50(3) and 50(4). The first piezoelectric vibration unit 50(1) includes a first cantilever portion 55, which extends from the fixing portion 51 by a first overhanging length D1 in one direction. The second piezoelectric vibration unit 50(2) includes a second cantilever portion 55, which extends from the fixing portion 51 by a second overhanging length D2 in a direction that is opposite the one direction. The third piezoelectric vibration unit 50(3) includes a third cantilever portion 55, which extends from the fixing portion 51 by a third overhanging length D3 in a direction that is perpendicular to the one direction. The fourth piezoelectric vibration unit 50(4) includes a fourth cantilever portion 55, which extends from the fixing portion 51 by a fourth overhanging length D4 in a direction that is opposite the direction in which the third cantilever portion 55 extends. The first to fourth overhanging lengths D1, D2, D3 and D4 may be different from each other.

Figure 19A:
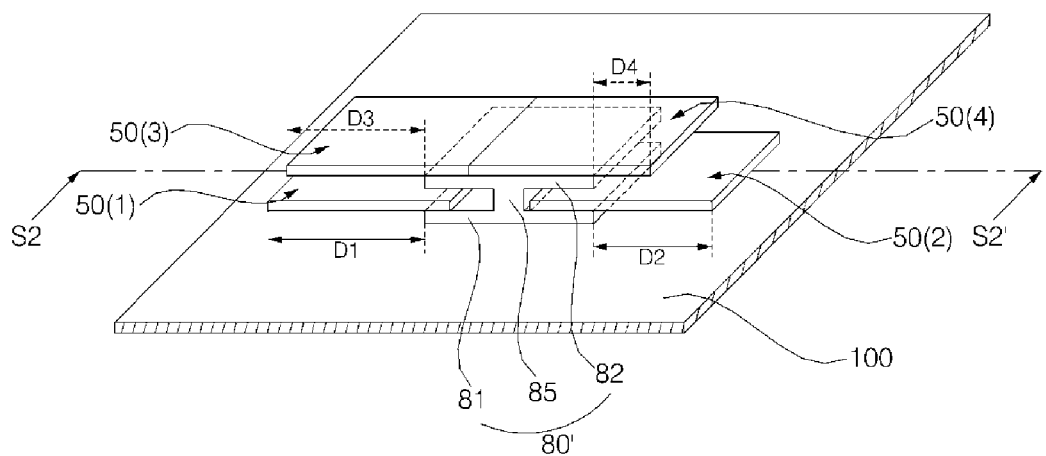
FIG. 19a is a perspective view illustrating a supporter 80' according to another embodiment and a plurality of piezoelectric vibration units 50(1), 50(2), 50(3) and 50(4) attached to the supporter 80'.
Figure 19B:
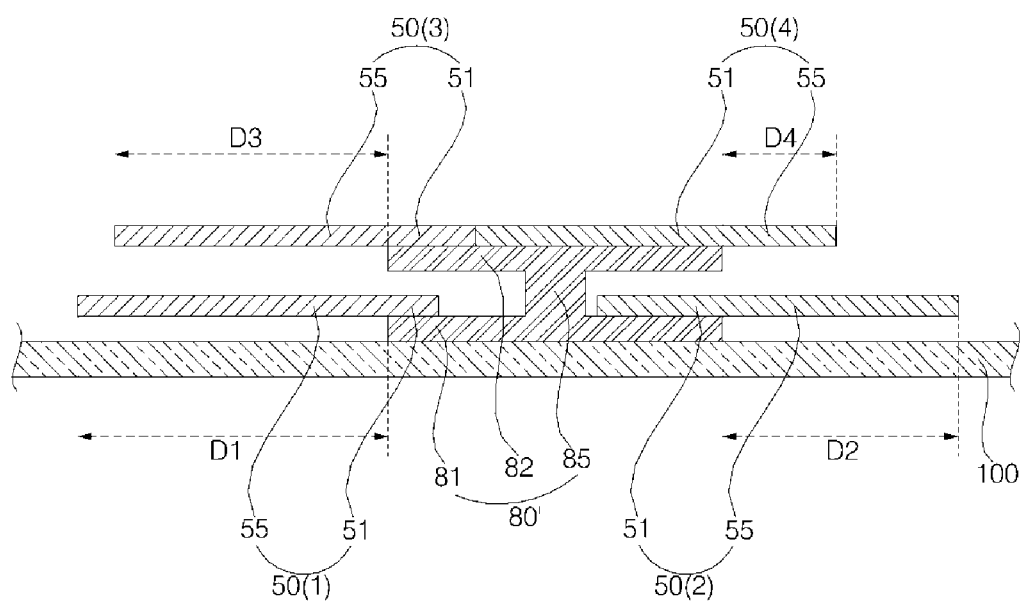

Referring to FIGS. 19a and 19b, a supporter 80' according to another embodiment a plurality of levels. The plurality of levels includes a first level 81 and a second level 82. the plurality of piezoelectric vibration units 50 include a first piezoelectric vibration unit 50(1) attached to the first level 81 of the plurality of levels, and a second piezoelectric vibration unit 50(3) attached to a second level 82 of the plurality of levels. The plurality of levels further includes a third piezoelectric vibration unit 50(2) attached to the first level 81 and a fourth piezoelectric vibration unit 50(4) attached to the second level 82. The first piezoelectric vibration unit 50(1) comprises a first fixing portion having a first fixing length and the first cantilever portion having a first overhanging length D1. The second piezoelectric vibration unit 50(3) comprises a second fixing portion having a second fixing length and a second cantilever portion having a second overhanging length D3. The third piezoelectric vibration unit 50(2) comprises a third fixing portion having a third fixing length and a third cantilever portion having a third overhanging length D2. The fourth piezoelectric vibration unit 50(4) comprises a fourth fixing portion having a fourth fixing length and a fourth cantilever portion having a fourth overhanging length. The first, second, third, and fourth fixing portions all may have different lengths. The first, second, third, and fourth cantilever portions all may have different lengths.

Referring to FIGS. 19a and 19b, a supporter 80' according to another embodiment includes a first base 81, which is attached to the rear surface of the display panel 100. The supporter 80' includes a second base 82, which is disposed behind the first base 81 while being spaced apart from the first base 81. The supporter 80' includes a connection portion 85, which connects the first base 81 and the second base 82 so as to support the second base 82. The first base 81 may be formed in a plate type having a predetermined thickness in the front-rear direction. The second base 82 may be formed in a plate type having a predetermined thickness in the front-rear direction. The front end of the connection portion 85 may be secured to the rear surface of the first base 81 and the rear end of the connection portion 85 may be secured to the front surface of the second base 82. The connection portion 85 forms a gap between the first base 81 and the second base 82. At least one of the piezoelectric vibration units 50 is attached to the first base 81, and at least one of the piezoelectric vibration units 50 is attached to the second base 82. The piezoelectric vibration units 50(1) and 50(2) that are attached to the first base 81 and the piezoelectric vibration units 50(3) and 50(4) that are attached to the second base 82 may be arranged so as to be spaced apart from each other in the front-rear direction. The piezoelectric vibration units 50 include first and second piezoelectric vibration units 50(1) and 50(2), which are attached to the first base 81, and third and fourth piezoelectric vibration units 50(3) and 50(4), which are attached to the second base 82.

As is apparent from the above description, the present invention provides a display apparatus in which the visual or acoustical vibration generation position is located on the display panel, thereby increasing the immersion level of a viewer with respect to the image.

Further, the distance between the visual sound generation position and the acoustical sound generation position is minimized by outputting a sound through direct vibration of the display panel.

Further, the distance between the visual vibration generation position and the tactile vibration generation position is minimized by enabling the user to feel direct vibration of the display panel.

Further, owing to the piezoelectric vibration unit including the supporter and the cantilever portion, it is possible to increase the magnitude of the output in the low frequency range of the piezoelectric vibration unit.

Further, as a result of the cantilever portion being formed to be longer than the fixing portion, it is possible to increase the magnitude of the output in the relatively low frequency range, in which the magnitude of the output is extremely low in a conventional piezoelectric vibration unit, and to further amplify the increase level Q of the magnitude of the output in a predetermined sub-range in the low frequency range.

The increase in the vibration output in the low frequency range from 100 Hz to 800 Hz is a considerably advantageous effect. This is because the range from 100 Hz to 800 Hz is a range in which the vibration output is relatively low when a weight member is absent, in comparison with other frequency ranges of the piezoelectric vibration unit, which has a frequency range of less than or equal to 16,000 Hz, and because the range from 100 Hz to 800 Hz is a range in which the user can recognize a sound image.

Further, since the frequency of the human voice is usually 100 Hz or more, it is very important to increase the vibration output in the low frequency range of greater than or equal to 100 Hz in order to prevent a perceived disconnect between the image and the sound.

Further, owing to the piezoelectric vibration unit including the supporter and the cantilever portion, it is possible to increase the magnitude of the output in the high frequency range as well as the magnitude of the output in the low frequency range of the piezoelectric vibration unit.

Further, owing to the plurality of cantilever portions having overhanging lengths different from each other, it is possible to greatly increase the magnitude of the output in a plurality of predetermined sub-ranges in the low frequency range.

Further, it is possible to selectively generate an output in any one or all of the plurality of predetermined sub-ranges in the low frequency range by performing control such that electric energy is selectively applied to the plurality of cantilever portions. As a result of the piezoelectric vibration unit 50 being formed in a rectangular shape when seen from rear side and extending in a direction parallel to any one side of the rectangle, the degree to which the output amplification is concentrated in a predetermined specific sub-range in the low frequency range may be further increased, and it may become easy for a designer to accurately predetermine the specific sub-range in which the amplification is greatly achieved. Further, it may also be possible to set the predetermined specific sub-range in the low frequency range to be narrower.

As a result of the cantilever portion extending in a direction parallel to the long side of the rectangular-shaped piezoelectric vibration unit, it is possible for a designer to predetermine the overhanging length of the cantilever portion within a wider range and to further increase the output in the low frequency range.

As a result of the overhanging length of the cantilever portion being set to be greater than or equal to the fixing length of the fixing portion or to be 20 mm or more, the maximum-increase frequency P may fall within the low frequency range.

As a result of the overhanging length of the cantilever portion being set to be at least four times as large as the fixing length of the fixing portion or to be 30 mm or more, the maximum-increase frequency P may be predetermined to be from about 150 to 350 Hz, and the increase level Q may become larger.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
   a display panel;
   a supporter attached to a rear surface of the display panel; and
   at least one piezoelectric vibration unit including a fixing portion attached to the supporter and a plurality of a cantilever portions overhanging from the supporter,
   wherein an overhanging length of each of the plurality of cantilever portions is different from each other.

2. The display apparatus according to claim 1, wherein the piezoelectric vibration unit is formed in a rectangular shape when seen from rear side, and
   the cantilever portion overhangs in a direction parallel to any one side of the rectangular shape.

3. The display apparatus according to claim 2, wherein the cantilever portion overhangs in a direction parallel to a long side of the rectangular shape.

4. The display apparatus according to claim 1, wherein the supporter comprises:
   a first surface attached to the display panel; and
   a second surface to which the fixing portion is attached, wherein the second surface is opposite of the first side.

5. The display apparatus according to claim 1, wherein the cantilever portion is spaced apart from the rear surface of the display panel.

6. The display apparatus according to claim 1, wherein the cantilever portion has a predetermined overhanging length being greater than or equal to a fixing length of the fixing portion.

7. The display apparatus according to claim 6, wherein the overhanging length is at least four times as large as the fixing length.

8. The display apparatus according to claim 6, wherein the piezoelectric vibration unit has a thickness from 0.6 mm to 1 mm, and
   a sum of the overhanging length and the fixing length is from 35 mm to 45 mm.

9. The display apparatus according to claim 1, wherein the cantilever portion has an overhanging length of 20 mm or more.

10. The display apparatus according to claim 1, wherein the plurality of cantilever portions includes:
    a one-directional cantilever portion extending from the fixing portion in one direction; and
    an other-directional cantilever portion extending from the fixing portion in a direction perpendicular to the one direction or in a direction opposite the one direction.

11. The display apparatus according to claim 1, wherein the plurality of cantilever portions includes:
    a first-directional cantilever portion extending from the fixing portion in a first direction;
    a second-directional cantilever portion extending from the fixing portion in a direction perpendicular to the first direction; and
    a third-directional cantilever portion extending from the fixing portion in a direction opposite the first direction.

12. The display apparatus according to claim 11, wherein the cantilever portion overhangs from three or more sides of the supporter.

13. The display apparatus according to claim 1, wherein the at least one piezoelectric vibration unit includes a plurality of piezoelectric vibration units, and
    the plurality of piezoelectric vibration units include cantilever portions having predetermined overhanging lengths, at least two of the overhanging lengths being different from each other.

14. The display apparatus according to claim 1, wherein the at least one piezoelectric vibration unit includes a plurality of piezoelectric vibration units, and
    the plurality of piezoelectric vibration units include:
    a first piezoelectric vibration unit including a first cantilever portion overhanging a first overhanging length; and
    a second piezoelectric vibration unit including a second cantilever portion overhanging a second overhanging length, the second overhanging length being different from the first overhanging length.

15. The display apparatus according to claim 14, wherein the first cantilever portion of the first piezoelectric vibration unit overhangs in a direction opposite a direction in which the second cantilever portion of the second piezoelectric vibration unit overhangs.

16. The display apparatus according to claim 14, wherein the fixing portion of the first piezoelectric vibration unit has a fixing length being same as a fixing length of the fixing portion of the second piezoelectric vibration unit.

17. The display apparatus according to claim 14, wherein a sum of the first overhanging length and a fixing length of the fixing portion of the first piezoelectric vibration unit is same as a sum of the second overhanging length and a fixing length of the fixing portion of the second piezoelectric vibration unit.

18. The display apparatus according to claim 1, wherein the at least one piezoelectric vibration unit includes a plurality of piezoelectric vibration units,
    the supporter includes a plurality of levels, and
    the plurality of piezoelectric vibration units include:
    a first piezoelectric vibration unit attached to a first level of the plurality of levels; and
    a second piezoelectric vibration unit attached to a second level of the plurality of levels.

19. A display apparatus comprising:
    a display panel;
    a supporter attached to a rear surface of the display panel; and
    first to $n^{th}$ piezoelectric vibration units attached to the supporter,
    wherein each of the first to $n^{th}$ piezoelectric vibration units includes a fixing portion attached to the supporter and a cantilever portion overhanging from the supporter,
    the cantilever portion of each of the first to $n^{th}$ piezoelectric vibration units has an overhanging length different from an overhanging length of the cantilever portion of at least one of remaining ones of the first to $n^{th}$ piezoelectric vibration units, and
    n is a natural number of 2 or more.

20. A display apparatus comprising:
    a display panel;
    a first supporter attached to a rear surface of the display panel;
    a second supporter attached to the rear surface of the display panel and spaced apart from the first support;

a first piezoelectric vibration unit including a first fixing portion attached to the first supporter and a first cantilever portion overhanging from the first supporter by a first overhanging length; and a second piezoelectric vibration unit including a second fixing portion attached to the second supporter and a second cantilever portion overhanging from the second supporter by a second overhanging length, the second overhanging length being different from the first overhanging length.

* * * * *